(12) United States Patent
Ka et al.

(10) Patent No.: US 12,029,082 B2
(45) Date of Patent: Jul. 2, 2024

(54) DISPLAY DEVICE

(71) Applicant: Samsung Display Co., Ltd., Yongin-Si (KR)

(72) Inventors: Ji-Hyun Ka, Seongnam-si (KR); Taehoon Kwon, Suwon-si (KR); Ji-Eun Lee, Seoul (KR); Minhee Choi, Hwaseong-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 238 days.

(21) Appl. No.: 17/090,056

(22) Filed: Nov. 5, 2020

(65) Prior Publication Data

US 2021/0202656 A1 Jul. 1, 2021

(30) Foreign Application Priority Data

Dec. 26, 2019 (KR) .................. 10-2019-0175219

(51) Int. Cl.
*H10K 59/131* (2023.01)
*H10K 50/844* (2023.01)

(52) U.S. Cl.
CPC ......... *H10K 59/131* (2023.02); *H10K 50/844* (2023.02)

(58) Field of Classification Search
CPC ........... H10K 27/3276; H10K 51/5253; H10K 59/131; H10K 59/873; H10K 50/844
See application file for complete search history.

(56) References Cited

U.S. PATENT DOCUMENTS

| | | | |
|---|---|---|---|
| 9,274,389 B2 | 3/2016 | Kang et al. | |
| 9,748,322 B2 | 8/2017 | Ki et al. | |
| 10,121,977 B2 | 11/2018 | Lee et al. | |
| 10,211,277 B2 | 2/2019 | Lee et al. | |
| 10,446,636 B2 | 10/2019 | Lee et al. | |
| 2017/0287394 A1 | 10/2017 | Kim et al. | |
| 2019/0123126 A1* | 4/2019 | Song | H10K 77/111 |
| 2019/0164995 A1* | 5/2019 | Lee | H10K 77/111 |

FOREIGN PATENT DOCUMENTS

| | | | |
|---|---|---|---|
| KR | 1020170066535 A | 6/2017 | |
| KR | 1020170114034 A | 10/2017 | |
| KR | 1020180021341 A | 3/2018 | |

(Continued)

*Primary Examiner* — Vongsavanh Sengdara
(74) *Attorney, Agent, or Firm* — CANTOR COLBURN LLP

(57) ABSTRACT

A display device includes: a base layer comprising a first portion, a second portion extending from the first portion, and a third portion extending from the second portion; a first light emitting element disposed on the first portion; a first front signal line electrically connected to the first light emitting element and disposed on the first portion; a second front signal line electrically connected to the first front signal line, disposed on the first portion, disposed in a different layer from the first front signal line, and overlapping the first front signal line; a first connection line electrically connected to the first and second front signal lines, disposed on the second portion, and disposed in a different layer from the first and second front signal lines; and a first rear signal line electrically connected to the first connection line and disposed on the third portion.

14 Claims, 27 Drawing Sheets

(56) References Cited

FOREIGN PATENT DOCUMENTS

| KR | 1020180042504 A | 4/2018 |
| KR | 1020180056497 A | 5/2018 |
| KR | 101888423 B1 | 8/2018 |
| KR | 1020190045962 A | 5/2019 |
| KR | 1020210027641 A | 3/2021 |

\* cited by examiner

DISPLAY DEVICE

This application claims priority to Korean Patent Application No. 10-2019-0175219, filed on Dec. 26, 2019, and all the benefits accruing therefrom under 35 U.S.C. § 119, the content of which in its entirety is hereby incorporated by reference.

BACKGROUND

1. Field

The disclosure relates to a display device. More particularly, the disclosure relates to a display device having a narrow bezel.

2. Description of the Related Art

A display device displays various images through a display screen to provide a user with information. In general, the display device displays an image within the display screen defined thereon.

The display device includes a display area for displaying information and a non-display area surrounding the display area.

Recently, as a size of the display device increases, the number of signal lines arranged in the non-display area increases to correspond to an increased size of a display panel and to realize a high resolution.

SUMMARY

When the size of a display panel with a high resolution increases, a resistance of the signal lines increases, such that display characteristics may be deteriorated. Accordingly, research for reducing the resistance of the signal lines and securing scan time of each of the signal lines to improve display quality are desired.

The disclosure provides a display device having a narrow bezel with improved display quality.

An embodiment of the invention provides a display device including: a base layer including a first portion, a second portion extending from the first portion, and a third portion extending from the second portion; a first light emitting element disposed on the first portion; a first front signal line electrically connected to the first light emitting element and disposed on the first portion; a second front signal line electrically connected to the first front signal line, disposed on the first portion, disposed in a different layer from the first front signal line, and overlapping the first front signal line; a first connection line electrically connected to the first front signal line and the second front signal line, disposed on the second portion, and disposed in a different layer from the first front signal line and the second front signal line; and a first rear signal line electrically connected to the first connection line and disposed on the third portion.

In an embodiment, the second portion may be bent, and the third portion may overlap the first portion when viewed in a plan view.

In an embodiment, the display device may further include: a first insulating layer, a second insulating layer, a third insulating layer and a fourth insulating layer, which are sequentially stacked on the base layer, where an opening may be defined through the first insulating layer, the second insulating layer, the third insulating layer, and the fourth insulating layer to correspond to the second portion; and a fifth insulating layer disposed on the fourth insulating layer, where at least a portion of the fifth insulating layer is disposed inside the opening. In such an embodiment, the first front signal line and the second front signal line may be disposed at different positions among a first position, a second position, and a third position, the first position may be defined between the first insulating layer and the second insulating layer, the second position may be defined between the second insulating layer and the third insulating layer, and the third position may be defined between the third insulating layer and the fourth insulating layer.

In an embodiment, the first connection line may be disposed on the fifth insulating layer and may overlap the opening.

In an embodiment, the first to fourth insulating layers may include an inorganic material, and the fifth insulating layer may include an organic material.

In an embodiment, the display device may further include a transistor disposed on the first portion of the base layer and electrically connected to the first light emitting element and a connection electrode electrically connected to the transistor. In such an embodiment, the transistor may include a source, a drain, and an active, which are disposed under the first insulating layer, and a gate disposed between the first insulating layer and the second insulating layer, and the connection electrode may be disposed at one of the first, second, and third positions.

In an embodiment, the first rear signal line may be disposed in a same layer as one of the first front signal line and the second front signal line.

In an embodiment, the display device may further include a fourth rear signal line electrically connected to the first connection line, disposed on the third portion, and disposed in a different layer from the first rear signal line.

In an embodiment, the display device may further include a data driving circuit disposed on the third portion, and the data driving circuit may be electrically connected to the first rear signal line.

In an embodiment, the first front signal line and the second front signal line may include a first metal material, and the first metal material may have a first specific resistance.

In an embodiment, the first connection line may include a second metal material different from the first metal material, and the second metal material may have a second specific resistance different from the first specific resistance.

In an embodiment, the display device may further include: a second light emitting element disposed on the first portion and arranged in a same pixel row as the first light emitting element; a third front signal line electrically connected to the second light emitting element, disposed on the first portion, and disposed in a different layer from the first front signal line and the second front signal line; a second connection line electrically connected to the third front signal line and disposed on the second portion; and a second rear signal line electrically connected to the second connection line and disposed on the third portion.

In an embodiment, the display device may further include a third rear signal line electrically connected to the second connection line, disposed on the third portion, and disposed in a different layer from the second rear signal line.

In an embodiment, the third front signal line is disposed in a same layer as one of the second rear signal line and the third rear signal line.

An embodiment of the invention provides a display device including: a base layer including a first portion, a second portion extending from the first portion, and a third portion extending from the second portion; a first light emitting element, a second light emitting element, and a third light emitting element, which are disposed on the first portion; a first front signal line electrically connected to the first light emitting element and disposed on the first portion; a second front signal line electrically connected to the first front signal line; a third front signal line electrically connected to the second light emitting element and disposed on the first portion; a fourth front signal line electrically connected to the third light emitting element and disposed on the first portion, a fifth front signal line electrically connected to the fourth front signal line; a first connection line electrically connected to the first front signal line; a second connection line electrically connected to the third front signal line; a third connection line electrically connected to the fifth front signal line; a first rear signal line electrically connected to the first connection line; a second rear signal line electrically connected to the second connection line; and a third rear signal line electrically connected to the third connection line. In such an embodiment, the first, second, and third light emitting elements are arranged in a same pixel row.

In an embodiment, the second portion of the base layer may be bent, and the third portion may overlap the first portion when viewed in a plan view.

In an embodiment, the display device may further include: a first insulating layer, a second insulating layer, a third insulating layer, and a fourth insulating layer, which are sequentially stacked on the base layer, where an opening may be defined through the first insulating layer, the second insulating layer, the third insulating layer and the fourth insulating layer to correspond to the second portion; and a fifth insulating layer disposed on the fourth insulating layer, where at least a portion of the fifth insulating layer may be disposed inside the opening. In such an embodiment, the first, second, and third front signal lines may be disposed at different positions among a first position, a second position, and a third position, the first position may be defined between the first insulating layer and the second insulating layer, the second position may be defined between the second insulating layer and the third insulating layer, the third position may be defined between the third insulating layer and the fourth insulating layer, and the first, second, and third connection lines may be disposed on the fifth insulating layer.

In an embodiment, the first to fourth insulating layers may include an inorganic material, and the fifth insulating layer may include an organic material.

In an embodiment, the first front signal line may be disposed in a same layer as the fourth front signal line, and the second front signal line may be disposed in a same layer as the fifth front signal line.

An embodiment of the invention provides a display device including: a base layer including a first portion, a second portion bent from the first portion, and a third portion extending from the second portion, a first light emitting element, a second light emitting element, and a third light emitting element, which overlap the first portion and are sequentially arranged in one pixel row; a first front signal line disposed on the first portion, where the first front signal line provides a corresponding data signal to the first light emitting element; a second front signal line disposed on the first portion, where the second front signal line provides a corresponding data signal to the second light emitting element; a third front signal line disposed on the first portion, where the third front signal line provides a corresponding data signal to the third light emitting element; a first connection line electrically connected to the first front signal line and disposed on the second portion; a second connection line electrically connected to the second front signal line and disposed on the second portion; a third connection line electrically connected to the third front signal line and disposed on the second portion; a first rear signal line electrically connected to the first connection line; a second rear signal line electrically connected to the second connection line; a third rear signal line electrically connected to the third connection line; and an auxiliary signal line overlapping a corresponding signal line among the first, second, and third front signal lines and the first, second, and third rear signal lines, disposed on a different layer from the corresponding signal line, and electrically connected to the corresponding signal line. In such an embodiment, the first and third front signal lines are disposed in a different layer from the second front signal line, the first and third rear signal lines are disposed in a different layer from the second rear signal line, and the auxiliary signal line is disposed in a different layer from a signal line adjacent to the corresponding signal line.

According to embodiments of the invention, as the signal lines for transmitting the data signal are defined by lines in different layers and connected to each other, a bezel of the display device becomes thin, and aesthetics of the display device may be improved. In such embodiments, color difference between the pixels are effectively reduced due to reduced resistance of the signal lines, such that the display device may have improved display quality.

BRIEF DESCRIPTION OF THE DRAWINGS

The above and other features of the disclosure will become readily apparent by reference to the following detailed description when considered in conjunction with the accompanying drawings, in which.

DETAILED DESCRIPTION

Figure 1A:
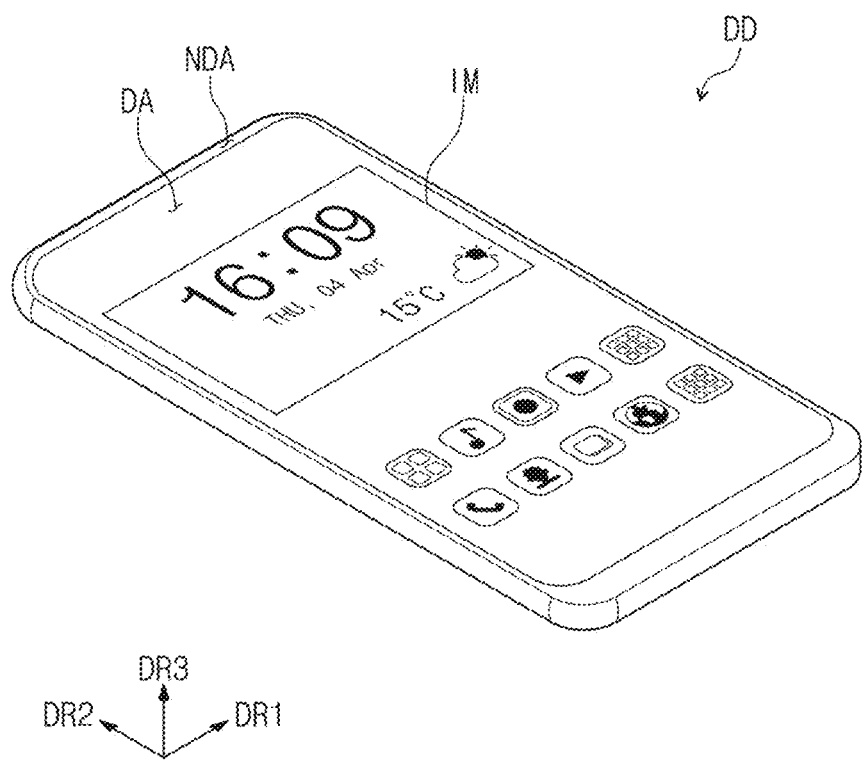
FIG. 1A is a perspective view showing a display device according to an exemplary embodiment of the disclosure.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on", "connected directly to" or "coupled directly to" another element, there are no intervening elements present.

The terminology used herein is for the purpose of describing particular embodiments only and is not intended to be limiting. As used herein, the singular forms "a," "an," and "the" are intended to include the plural forms, including "at least one," unless the context clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the claims.

Hereinafter, exemplary embodiments of the disclosure will be described in detail with reference to accompanying drawings.

Figure 1B:
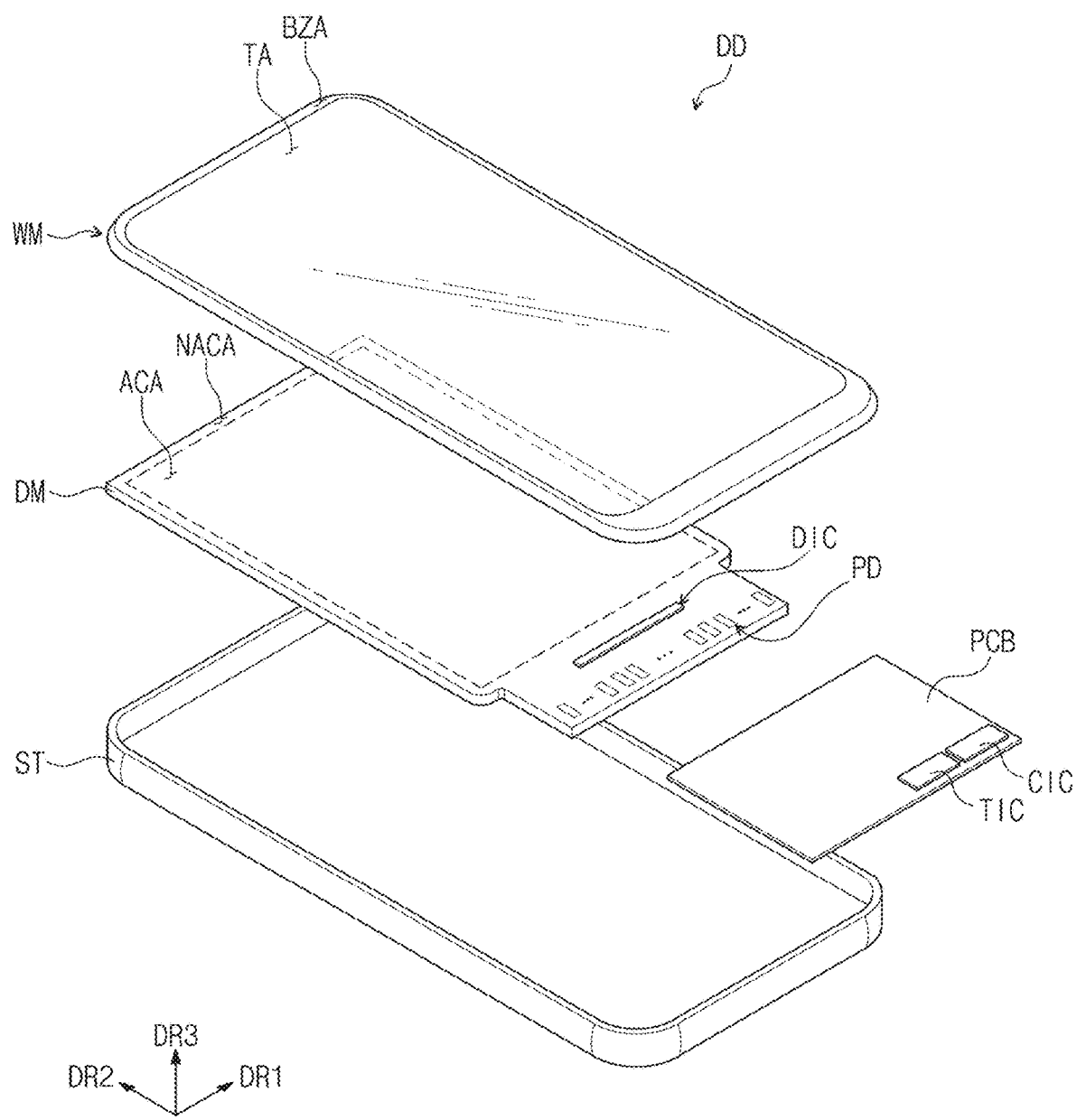
FIG. 1B is an exploded perspective view showing a display device according to an exemplary embodiment of the disclosure.

FIG. 1A is a perspective view showing a display device DD according to an exemplary embodiment of the disclosure. FIG. 1B is an exploded perspective view showing the display device DD according to an exemplary embodiment of the disclosure.

FIG. 1A shows an exemplary embodiment where the display device DD is applied to a smartphone. Alternatively, the display device DD may be applied to a large-sized electronic device, such as a television set or a monitor, and a small and medium-sized electronic device, such as a mobile phone, a tablet computer, a car navigation unit, a game unit, and a smart watch.

An exemplary embodiment of the display device DD may include a display area DA and a non-display area NDA, which are defined therein, but not being limited thereto or thereby. In such an embodiment, the display device DD may further include another area. The display area DA may be a pressure sensing area where an input sensor SP, which will be described later, senses an external input. The display area DA may display an image IM and may sense a user's input (for instance, a touch input).

The display area DA is substantially parallel to a surface defined by a first direction DR1 and a second direction DR2. A third direction DR3 indicates a normal line direction of the display area DA, i.e., a thickness direction of the display device DD. Front (or upper) and rear (or lower) surfaces of each member are distinguished from each other by the third direction DR3. However, directions indicated by the first, second, and third directions DR1, DR2, and DR3 are relative to each other and may be changed to other directions.

The shape of the display area DA shown in FIG. 1A is merely exemplary, and the shape of the display area DA may be variously modified without being limited thereto. The non-display area NDA is defined adjacent to the display area DA, and the image IM is not defined in the non-display area NDA. The non-display area NDA may define a bezel area of the display device DD. The non-display area NDA may surround the display area DA, but not being limited thereto or thereby. The shape of the display area DA and the shape of the non-display area NDA may be variously modified.

Referring to FIG. 1B, an exemplary embodiment of the display device DD may include a window WM, a display module DM, and a housing ST. The window WM may include a transmission area TA and a bezel area BZA, which are defined therein, but not being limited thereto or thereby. Alternatively, the window WM may further include another area.

The transmission area TA may transmit a light incident thereto. In such an embodiment, the image IM generated by the display module DM may be viewed by a user through the transmission area TA. The transmission area TA may overlap the display area DA.

The bezel area BZA may be defined adjacent to the transmission area TA. In such an embodiment, the bezel area BZA may surround the transmission area TA. In an exemplary embodiment of the disclosure, the bezel area BZA may have a predetermined color. The bezel area BZA may overlap the non-display area NDA.

The display module DM may be disposed under the window WM. The display module DM may be protected from external impacts by the window WM.

The display module DM may include an active area ACA and a non-active area NACA, which are defined therein. The active area ACA may correspond to the display area DA of FIG. 1A, may display the image IM, and may sense the user's input.

The non-active area NACA may correspond to the non-display area NDA, and lines that provide and receive electrical signals to and from the active area ACA may be disposed in the non-active area NACA.

At least a portion of the housing ST may be disposed under the display module DM. The housing ST may accommodate the window WM and the display module DM.

Figure 2A:
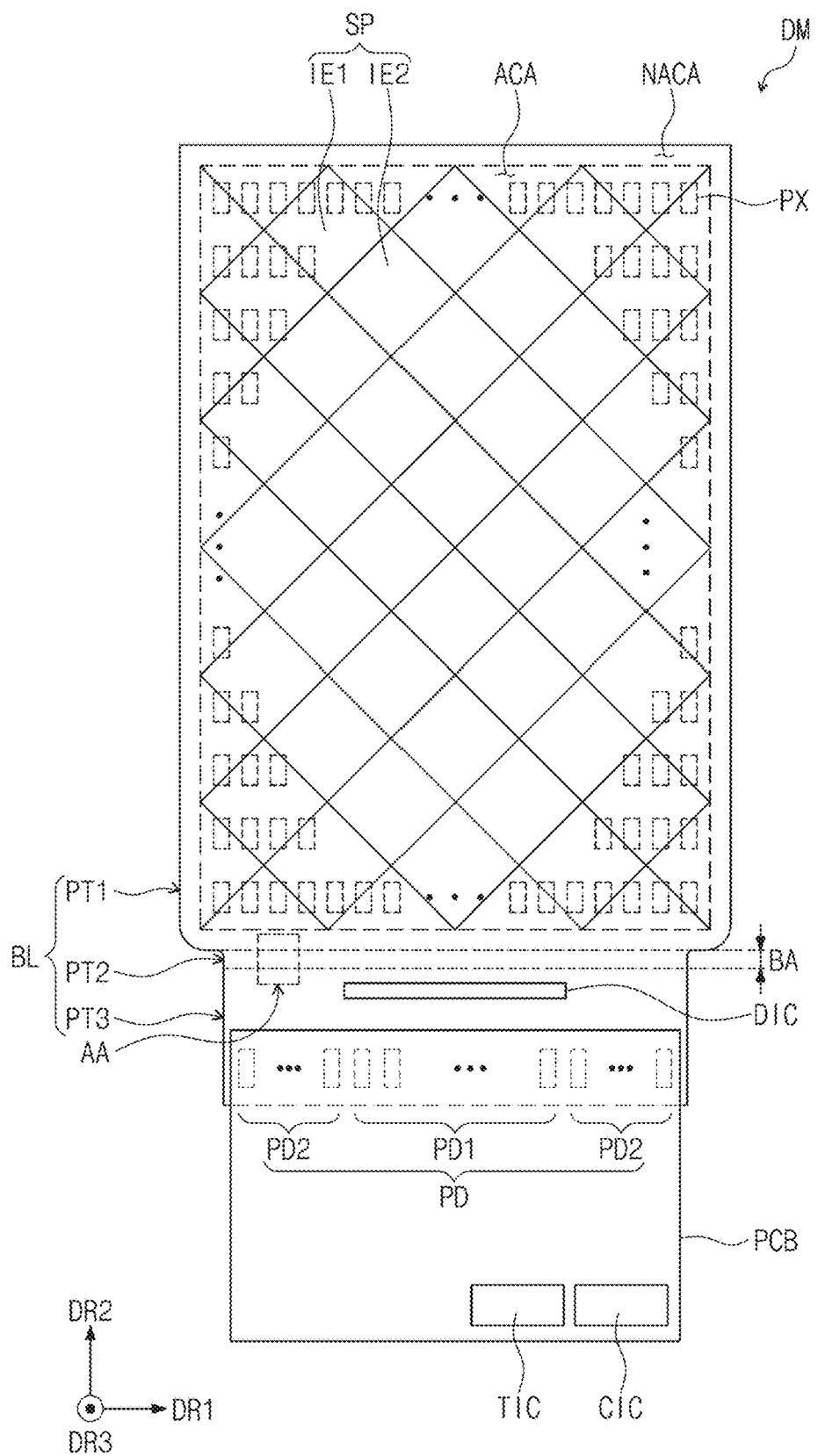
FIG. 2A is a plan view showing a display module according to an exemplary embodiment of the disclosure.
Figure 2B:
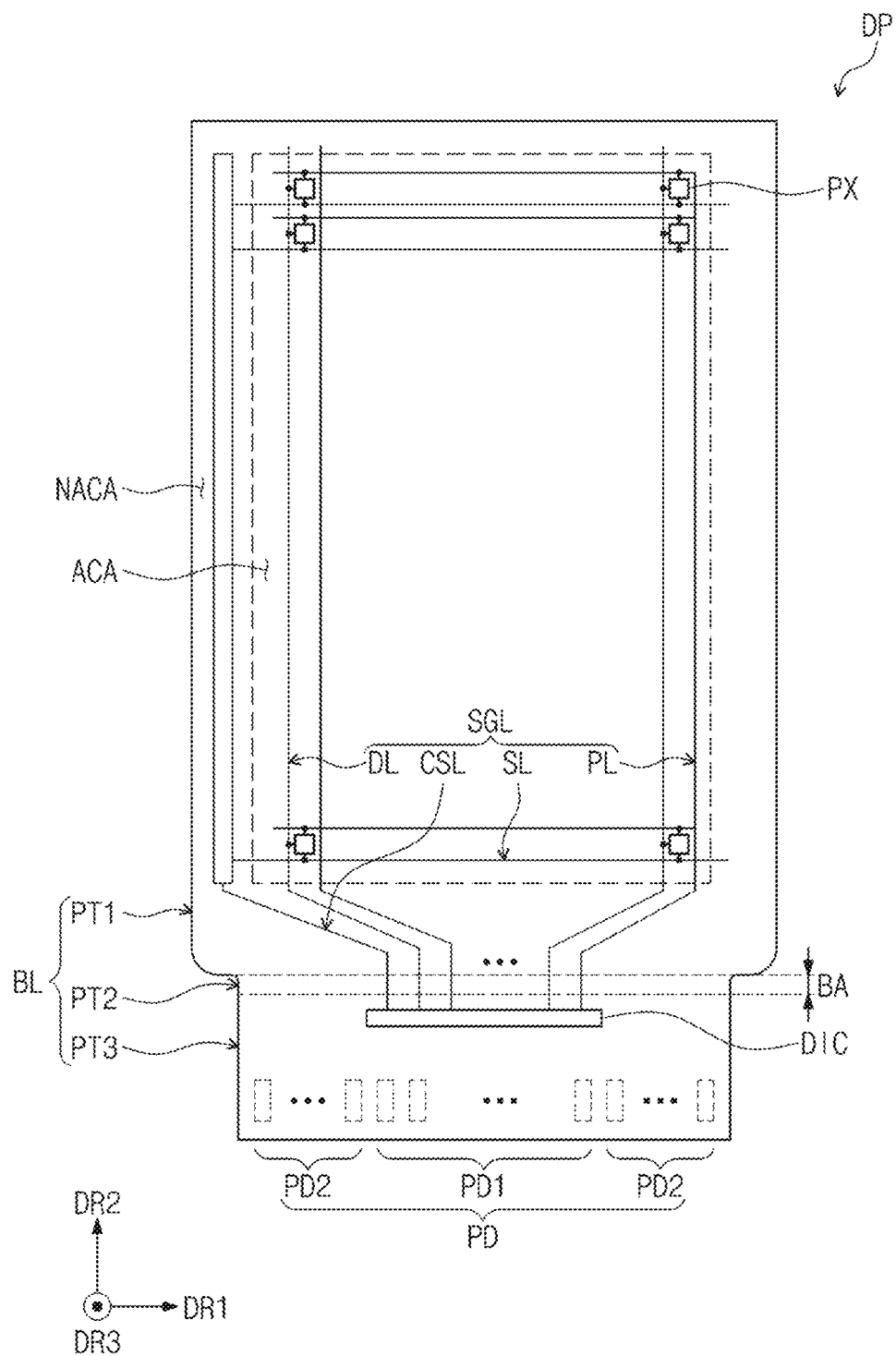
FIG. 2B is a plan view showing a display panel according to an exemplary embodiment of the disclosure.
Figure 3:
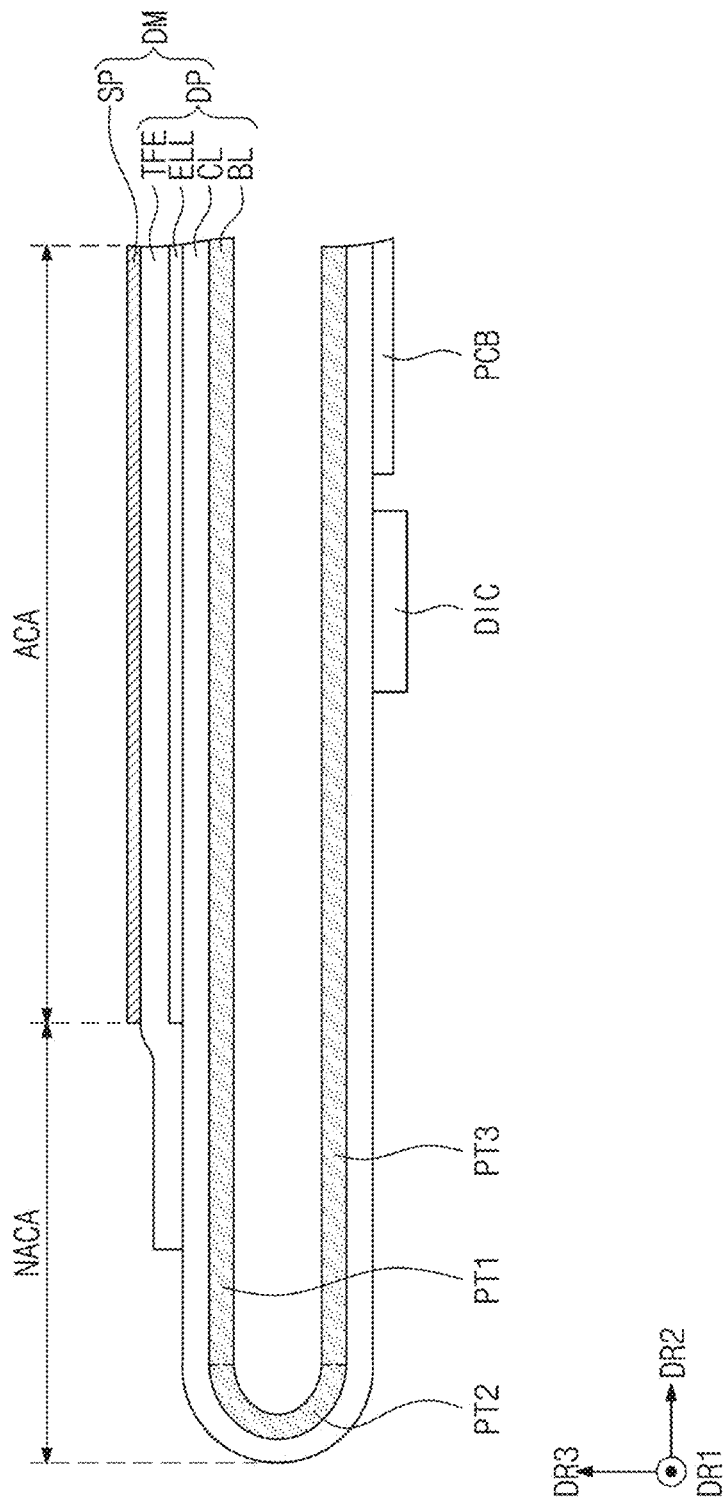
FIG. 3 is a view showing the display module shown in FIG. 2A, which is bent with respect to a bending area thereof.

FIG. 2A is a plan view showing the display module DM according to an exemplary embodiment of the disclosure. FIG. 2B is a plan view showing a display panel DP according to an exemplary embodiment of the disclosure. Particularly, a data driving circuit DIC and a plurality of pads PD, which are disposed on the display panel DP, are shown in FIGS. 2A and 2B. FIG. 3 is a view showing the display module DM shown in FIG. 2A, which is bent with respect to a bending area BA thereof.

An exemplary embodiment of the display module DM may include the display panel DP, the input sensor SP, the data driving circuit DIC, the pads PD, a printed circuit board PCB, an input sensing driving circuit TIC, and a control driving circuit CIC.

The display panel DP may include a base layer BL, a circuit layer CL, a light emitting element layer ELL, and an encapsulation layer TFE. In one exemplary embodiment, for example, the base layer BL may include polyimide ("PI"), but not being limited thereto. The base layer BL may include a first portion PT1, a second portion PT2 extending from the first portion PT1, and a third portion PT3 extending from the second portion PT2. In an exemplary embodiment, the first portion PT1, the second portion PT2, and the third portion PT3 may be defined by portions of the base layer BL integrally formed as a single unitary unit.

The second portion PT2 may be an area which is curved with a curvature. The third portion PT3 may be spaced apart from the first portion PT1 in the third direction DR3. The second portion PT2 of the base layer BL may be defined as the bending area BA. A length obtained by measuring the second portion PT2 of the base layer BL in the second direction DR2 may be modified.

The second portion PT2 may be bent downward toward the first portion PT1, and thus, the third portion PT3 may overlap the first portion PT1 when viewed in a plan view, i.e., a top plan view or a plan view in the third direction DR3.

The circuit layer CL may be disposed on the base layer BL and may include a pixel driving circuit and signal lines. For instance, the circuit layer CL may include a plurality of transistors (e.g., transistors T1 to T7 shown in FIG. 4A), a capacitor CP (refer to FIG. 4A), and a plurality of lines SGL (e.g., SL, DL, CSL, and PL shown in FIG. 2B) electrically connected to the transistors T1 to T7 (refer to FIG. 4A).

The circuit layer CL may overlap the first portion PT1, the second portion PT2, and the third portion PT3 of the base layer BL. However, configurations of the circuit layer CL corresponding to the first portion PT1, the second portion PT2, and the third portion PT3 may be different from each other. The circuit layer CL may include the pixel driving circuit disposed to correspond to the active area ACA of the first portion PT1 and the signal line disposed to correspond to the non-active area NACA of the first portion PT1. The circuit layer CL may include the signal lines disposed in different layers from each other to correspond to the second portion PT2 and the third portion PT3.

The light emitting element layer ELL may be disposed on the circuit layer CL and may overlap the first portion PT1 of the base layer BL. The light emitting element layer ELL may include a light emitting element LD (shown in FIG. 4A) electrically connected to the transistors T1 to T7 (shown in FIG. 4A). Pixels PX may be arranged in the light emitting element layer ELL in a matrix form.

The encapsulation layer TFE may be disposed on the light emitting element layer ELL and may encapsulate the light emitting element layer ELL. A portion of the encapsulation layer TFE may overlap the non-active area NACA. Although not shown separately, an insulating layer may be further disposed between the light emitting element layer ELL and the encapsulation layer TFE or between the encapsulation layer TFE and the input sensor SP to improve an optical property.

The input sensor SP may be disposed on the encapsulation layer TFE and may overlap the first portion PT1 of the base layer BL. FIG. 3 shows an exemplary embodiment where the input sensor SP is disposed directly on the encapsulation layer TFE, but not being limited thereto. In an alternative exemplary embodiment, the input sensor SP may be coupled onto the encapsulation layer TFE by an adhesive layer.

The input sensor SP may include a first sensor IE1 and a second sensor IE2. Each of the first sensor IE1 and the second sensor IE2 may include an electrode of a metal material. Each of the first sensor IE1 and the second sensor IE2 may have a mesh shape.

Each of the first sensor IE1 and the second sensor IE2 may be provided in plural. The first sensors IE1 may form a capacitance with the second sensors IE2. When the user touches the active area ACA, the capacitance between the first sensor IE1 and the second sensor IE2 may vary. The input sensing driving circuit TIC may sense a variation in capacitance of the input sensor SP and may determine which point of the active area ACA is touched by the user.

In such an embodiment, the configuration of the input sensor SP is not particularly limited. An input sensor of a mutual-capacitance driving scheme that includes two types of sensors may be applied to the display module DM, or an input sensor of a self-capacitance driving scheme that includes one type of sensor may be applied to the display module DM. Alternatively, an input sensor that is not a capacitive type sensor may be applied to the display module DM.

In an exemplary embodiment of the disclosure, the data driving circuit DIC may overlap the third portion PT3 of the base layer BL. In such an embodiment, the data driving circuit DIC may be mounted on the third portion PT3 of the base layer BL.

The data driving circuit DIC may be electrically connected to the pixels PX of the active area ACA and may apply a data signal to the pixels PX.

The pads PD may include a plurality of first pads PD1 and a plurality of second pads PD2.

The first pads PD1 may transmit electrical signals to the pixels PX through the data driving circuit DIC. In an exemplary embodiment of the disclosure, the first pads PD1 may be electrically connected to at least one selected from the transistors T1 to T7 of the pixels PX.

The second pads PD2 may be electrically connected to the input sensor SP. Each of the second pads PD2 may be electrically connected to one of the first electrodes IE1 and the second electrodes IE2.

The printed circuit board PCB may be electrically connected to the pads PD. The input sensing driving circuit TIC and the control driving circuit CIC may be mounted on the printed circuit board PCB.

The input sensing driving circuit TIC may sense a variation in capacitance of the input sensor SP using the second pads PD2. Accordingly, the input sensing driving circuit TIC may sense the user's touch applied to the active area ACA and a pressure applied to the active area ACA from the outside.

The control driving circuit CIC may be used to control at least one selected from the data driving circuit DIC and the input sensing driving circuit TIC.

A portion of the display module DM, which corresponds to the second portion PT2 (or the bending area BA) of the base layer BL, may be bent.

Although not shown separately, an anti-reflective member may be disposed between the display module DM and the window WM. In an exemplary embodiment of the disclosure, the anti-reflective member may be a polarizing film or a polarizing plate.

Although not shown, the display module DM may further include a synthetic resin layer or a synthetic resin film disposed to correspond to the bending area BA. The synthetic resin layer or the synthetic resin film may reduce a stress of the signal lines disposed in the bending area BA.

Figure 4A:
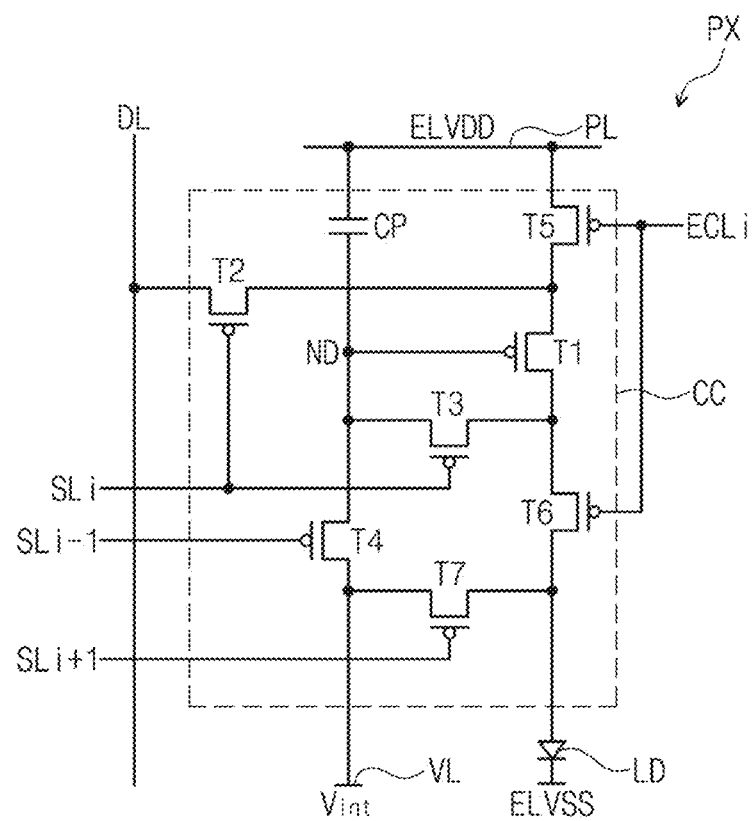
FIG. 4A is an equivalent circuit diagram showing a pixel according to an exemplary embodiment of the disclosure.
Figure 4B:
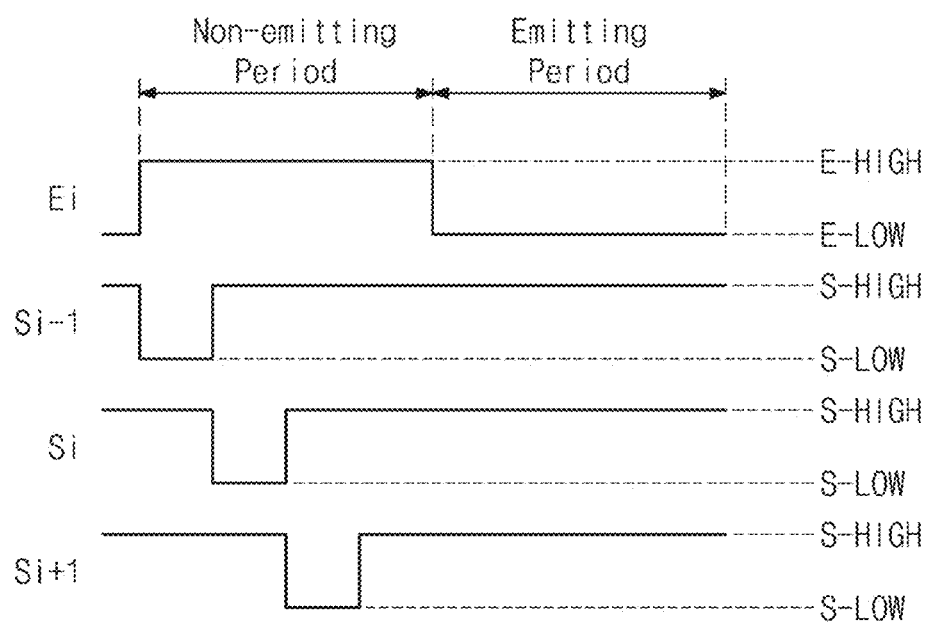
FIG. 4B is a waveform diagram showing driving signals applied to the pixel of FIG. 4A.

FIG. 4A is an equivalent circuit diagram showing the pixel PX according to an exemplary embodiment of the disclosure. FIG. 4B is a waveform diagram showing the driving signals applied to the pixel PX of FIG. 4A. FIG. 4A shows the pixel PX connected to an (i−1)-th scan line SLi−1, an i-th scan line SLi, an (i+1)-th scan line SLi+1, and an i-th light emitting control line ECLi.

The pixel PX may include the light emitting element LD and a pixel circuit CC. The pixel circuit CC may include the transistors T1 to T7 and the capacitor CP. The pixel circuit CC may control an amount of current flowing through the light emitting element LD in response to the data signal.

The light emitting element LD may emit the light at a predetermined luminance in response to the amount of the current provided from the pixel circuit CC. For such an operation, an electric potential of a first power source voltage ELVDD may be set to be higher than an electric potential of a second power source voltage ELVSS. The first power source voltage ELVDD may be provided to a first power line PL.

Each of the transistors T1 to T7 may include a source, a drain, and a gate. The source, the drain, and the gate may be implemented in the form of an electrode or may be implemented as or defined by a portion of a semiconductor pattern. In an exemplary embodiment where the source, the drain, and the gate are implemented in the form of an electrode, each of the source, the drain and the gate may include a metal pattern. In an alternative exemplary embodiment where the source, the drain, and the gate are implemented as the portion of the semiconductor pattern, each of the source, the drain, and the gate may have high doping concentration, and thus, may include a semiconductor area having a conductivity. In such an embodiment, an area that is not doped or has a relatively low doping concentration may correspond to an active of the transistor.

Hereinafter, for the convenience of description, one of the source and the drain may be referred to as a "first electrode", and the other of the source and the drain may be referred to as a "second electrode". The gate may be referred to as a "control electrode".

A first electrode of a first transistor T1 of the transistors T1 to T7 may be connected to the first power line PL via a fifth transistor T5 of the transistors T1 to T7, and a second electrode of the first transistor T1 may be connected to an anode electrode of the light emitting element LD via a sixth transistor T6 of the transistors T1 to T7. The first transistor T1 may also be referred to as a "driving transistor". The first transistor T1 may control the amount of the current flowing through the light emitting element LD in response to a voltage applied to the control electrode thereof.

A second transistor T2 of the transistors T1 to T7 may be connected between the data line DL and the first electrode of the first transistor T1. A control electrode of the second transistor T2 may be connected to the i-th scan line SLi. The second transistor T2 may be turned on when an i-th scan signal Si is applied to the i-th scan line SLi and may electrically connect the data line DL and the first electrode of the first transistor T1.

A third transistor T3 of the transistors T1 to T7 may be connected between the second electrode and the control electrode of the first transistor T1. A control electrode of the third transistor T3 may be connected to the i-th scan line SLi. The third transistor T3 may be turned on when the i-th scan signal Si is applied to the i-th scan line SLi and may electrically connect the second electrode and the control electrode of the first transistor T1. Accordingly, when the third transistor T3 is turned on, the first transistor T1 may be connected in a diode configuration.

A fourth transistor T4 of the transistors T1 to T7 may be connected between a control node ND and a second power line VL. A control electrode of the fourth transistor T4 may be connected to an (i−1)-th scan line SLi−1. The fourth transistor T4 may be turned on when an (i−1)-th scan signal Si−1 is applied to the (i−1)-th scan line SLi−1 and may apply an initialization voltage Vint to the control node ND.

A fifth transistor T5 of the transistors T1 to T7 may be connected between the first power line PL and the first electrode of the first transistor T1. A control electrode of the fifth transistor T5 may be connected to the i-th light emitting control line ECLi.

The sixth transistor T6 may be connected between the second electrode of the first transistor T1 and the anode electrode of the light emitting element LD. A control electrode of the sixth transistor T6 may be connected to the i-th light emitting control line ECLi.

A seventh transistor T7 of the transistors T1 to T7 may be connected between the second power line VL and the anode electrode of the light emitting element LD. A control electrode of the seventh transistor T7 may be connected to the (i+1)-th scan line SLi+1. The seventh transistor T7 may be turned on when an (i+1)-th scan signal Si+1 is applied to the (i+1)th scan line SLi+1 and may apply the initialization voltage Vint to the anode electrode of the light emitting element LD.

The capacitor CP may be connected between the first power line PL and the control node ND. The capacitor CP may be charged with the voltage corresponding to the data signal. When the fifth transistor T5 and the sixth transistor T6 are turned on due to the voltage charged in the capacitor CP, the amount of the current flowing through the first transistor T1 may be determined.

Referring to FIG. 4B, a light emitting control signal Ei may have a high level E-HIGH or a low level E-LOW. Each of the scan signals Si−1, Si, and Si+1 has a high level S-HIGH or a low level S-LOW.

When the light emitting control signal Ei has the high level E-HIGH, the fifth transistor T5 and the sixth transistor T6 are turned off. When the fifth transistor T5 is turned off, the first power line PL is electrically disconnected from the first electrode of the first transistor T1. When the sixth transistor T6 is turned off, the second electrode of the first transistor T1 is electrically disconnected from the anode electrode of the light emitting element LD. Accordingly, the light emitting element LD does not emit the light during a period in which the light emitting control signal Ei having the high level E-HIGH is provided to the i-th light emitting control line ECLi.

Then, when the (i−1)-th scan signal Si−1 applied to the (i−1)th scan line SLi-1 has the low level S-LOW, the fourth transistor T4 is turned on. When the fourth transistor T4 is turned on, the initialization voltage Vint is applied to the control node ND.

When the i-th scan signal Si applied to the i-th scan line SLi has the low level S-LOW, the second transistor T2 and the third transistor T3 are turned on. When the (i+1)-th scan signal Si+1 applied to the (i+1)-th scan line SLi+1 has the low level S-LOW, the seventh transistor T7 is turned on. When the second transistor T2 is turned on, the data signal is applied to the first electrode of the first transistor T1. In this case, since the voltage of the control node ND is initialized to the initialization voltage Vint, the first transistor T1 is turned on. When the first transistor T1 is turned on, the voltage corresponding to the data signal is applied to the control node ND. Accordingly, the capacitor CP is charged with the voltage corresponding to the data signal.

When the seventh transistor T7 is turned on, the initialization voltage Vint is applied to the anode electrode of the light emitting element LD, and a parasitic capacitance of the light emitting element LD is discharged.

When the light emitting control signal Ei applied to the i-th light emitting control line ECLi has the low level E-LOW, the fifth transistor T5 and the sixth transistor T6 are turned on. When the fifth transistor T5 is turned on, the first power source voltage ELVDD is provided to the first electrode of the first transistor T1. When the sixth transistor T6 is turned on, the second electrode of the first transistor T1 is electrically connected to the anode electrode of the light emitting element LD. Then, the light emitting element LD emits the light at the predetermined luminance in response to the amount of current provided thereto.

In an exemplary embodiment, as shown in FIG. 4A, the transistors T1 to T7 of the pixel PX may be P-type metal-oxide-semiconductor ("PMOS") transistors, but not being limited thereto or thereby. According to an alternative exemplary embodiment of the disclosure, the transistors T1 to T7 of the pixel PX may be N-type metal-oxide-semiconductor ("NMOS") transistors. According to another alternative exemplary embodiment, the pixel PX may be implemented by a combination of the NMOS transistors and the PMOS transistors.

The configuration of the pixel PX of the disclosure is not limited to that shown in FIG. 4A. According to an alternative exemplary embodiment of the disclosure, the pixel PX may be implemented in various ways to allow the light emitting element LD to emit the light. In an exemplary embodiment of the disclosure, the light emitting element LD may be a light emitting element including an organic light emitting element, a micro LED, or a quantum dot.

Figure 5A:
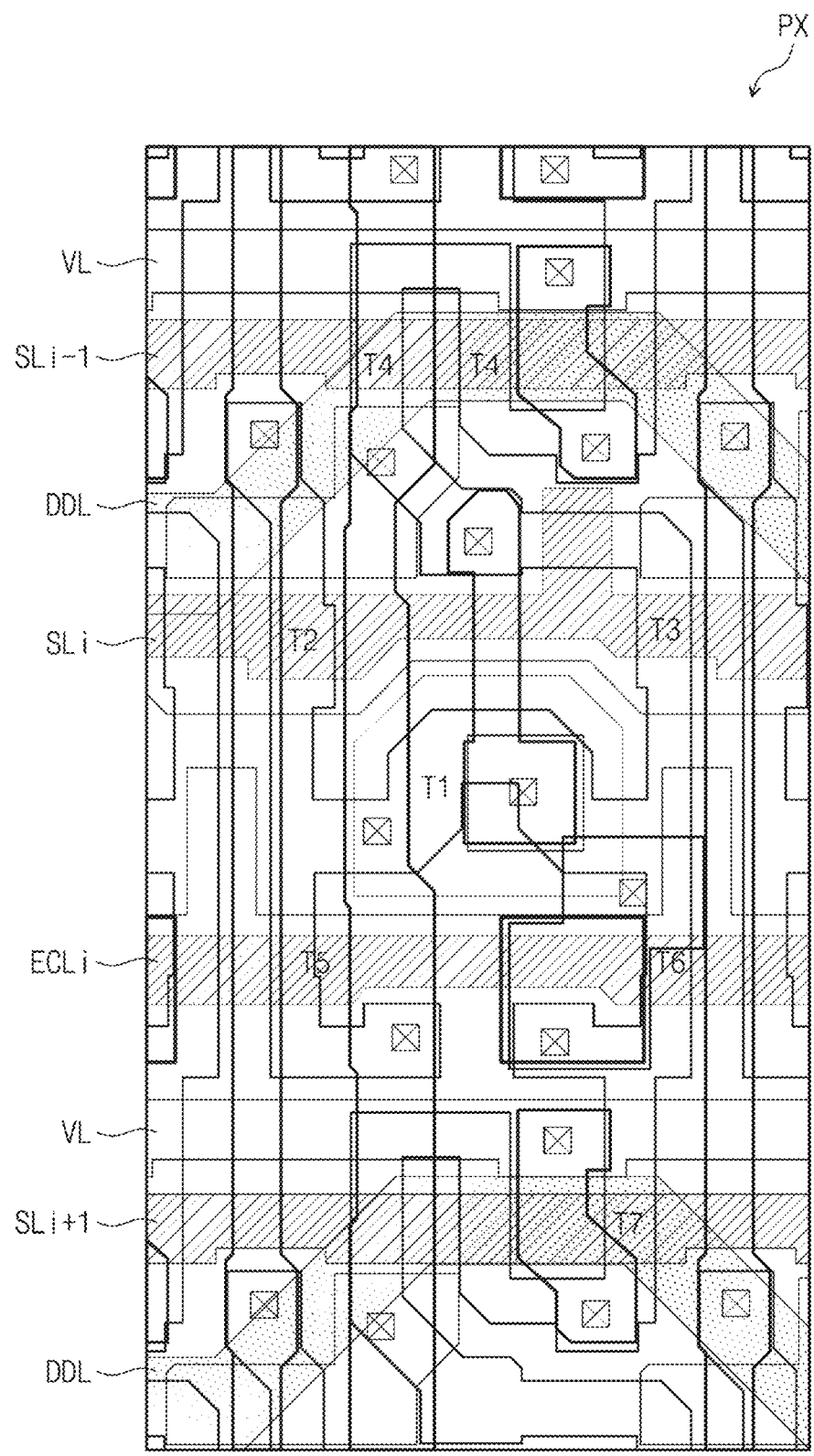
FIG. 5A is a plan view showing a pixel corresponding to the equivalent circuit of FIG. 4A.
Figure 5B:
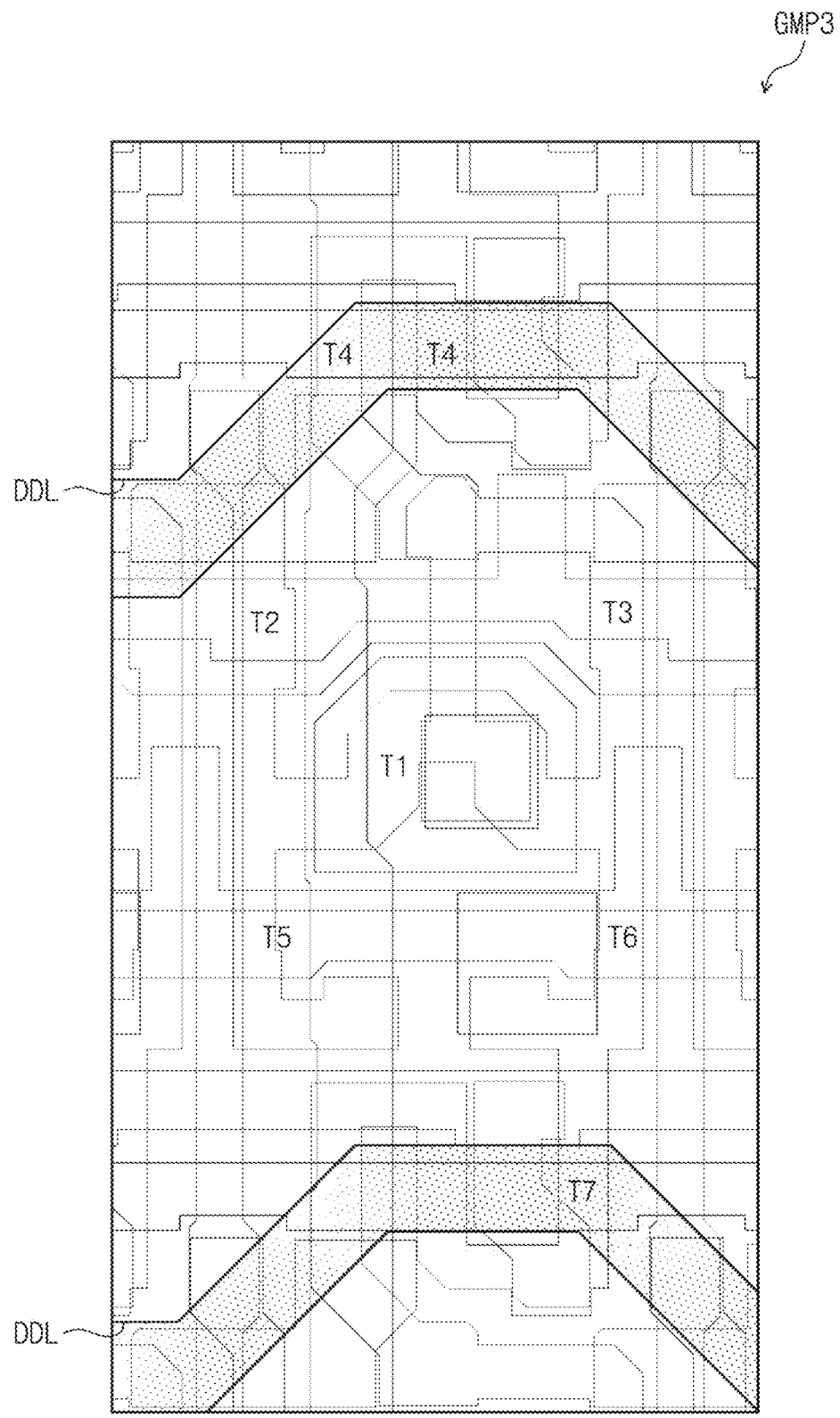
FIG. 5B is a plan view showing a conductive pattern included in a third conductive layer according to an exemplary embodiment of the disclosure.
Figure 6A:
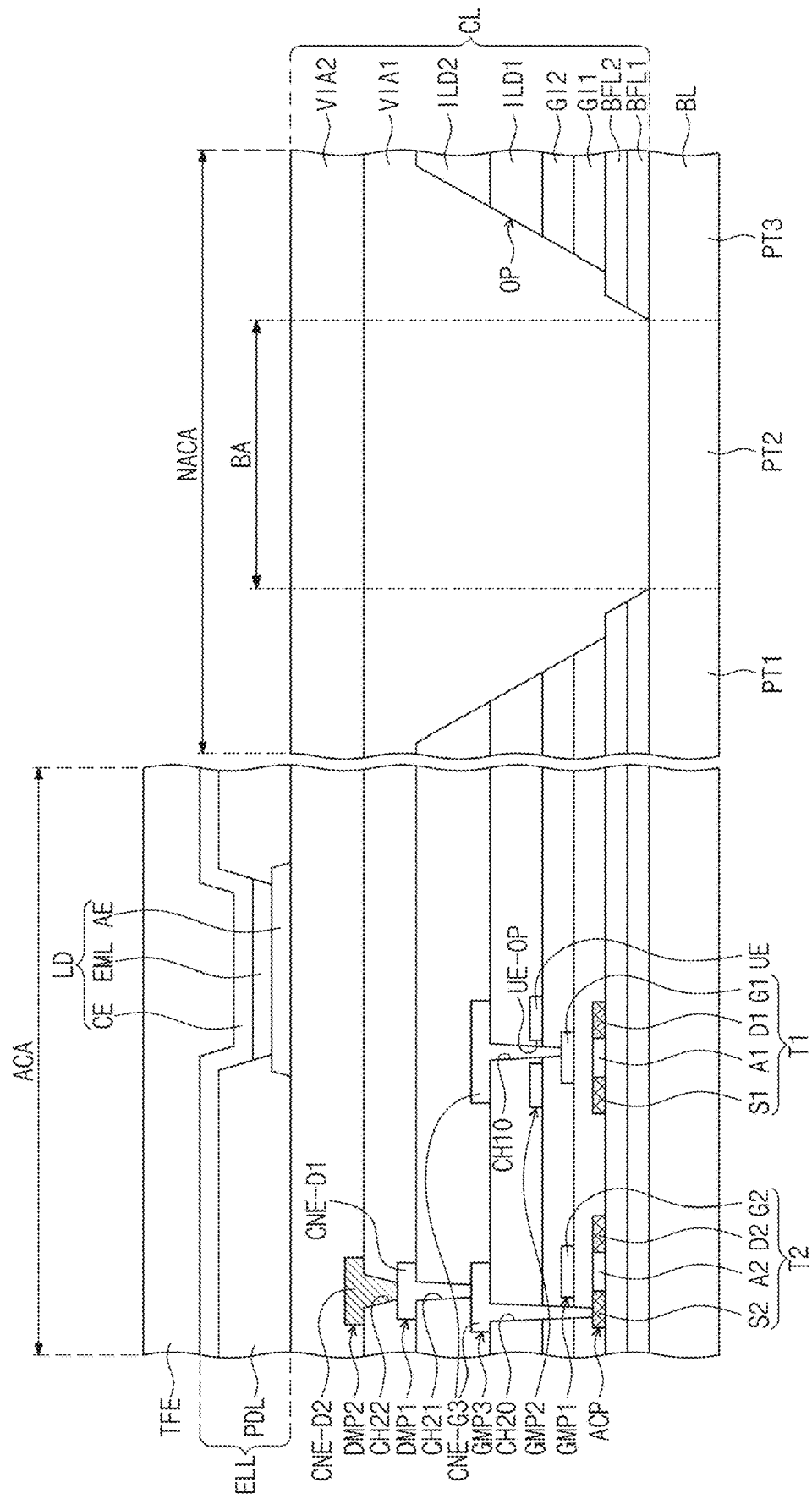
FIGS. 6A and 6B are cross-sectional views of the display panel according to an exemplary embodiment of the disclosure.
Figure 6B:
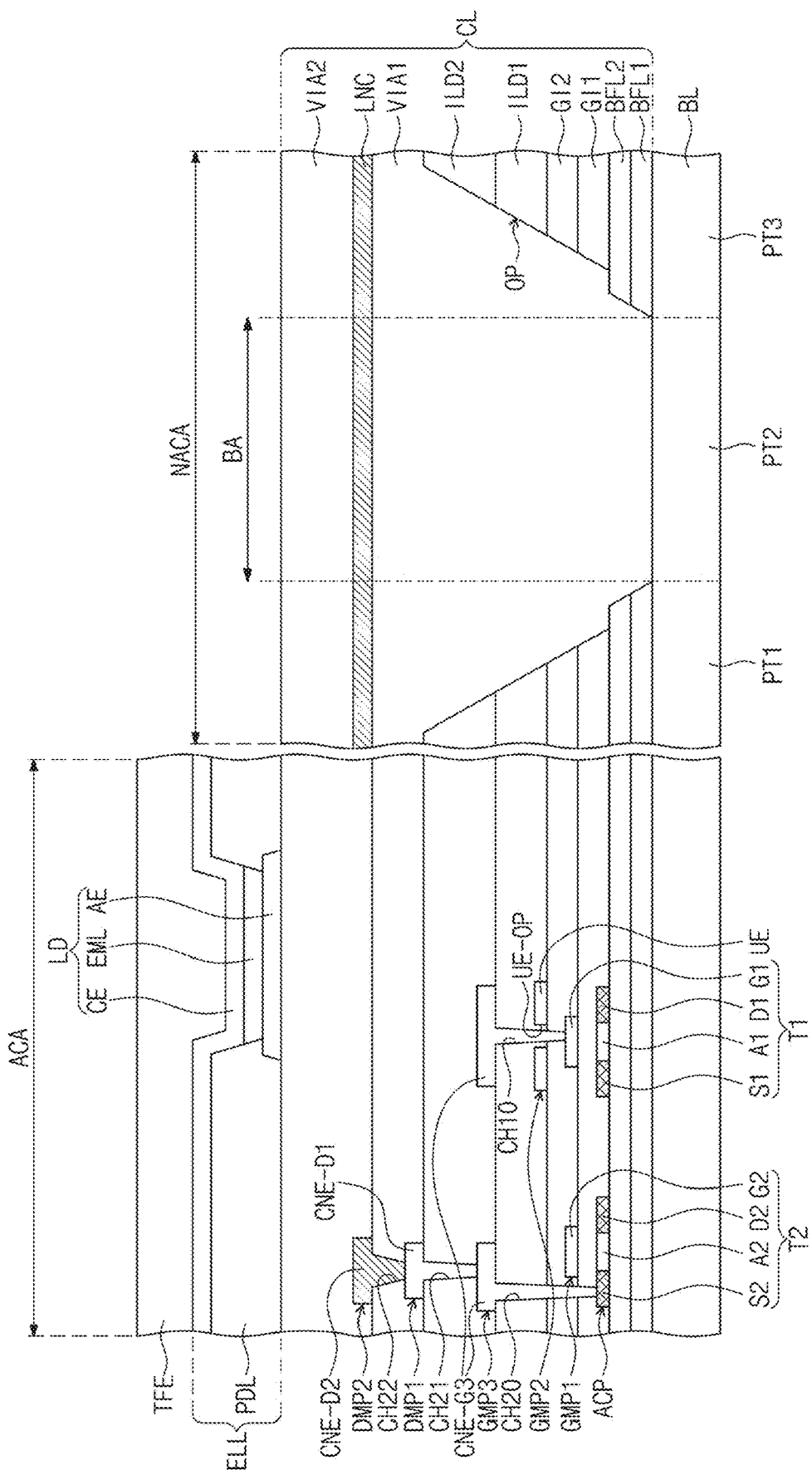

FIG. 5A is a plan view showing the pixel PX corresponding to the equivalent circuit of FIG. 4A. FIG. 5B is a plan view showing a conductive pattern included in a third conductive layer GMP3. FIGS. 6A and 6B are cross-sectional views showing the display panel DP according to an exemplary embodiment of the disclosure. FIGS. 6A and 6B partially include the active area ACA and the non-active area NACA. More particularly, FIG. 6A shows a cross-sectional view overlapping the signal line of the bending area BA, and FIG. 6B shows a cross-sectional view not overlapping the signal line of the bending area BA.

Referring to FIG. 5A, the first to seventh transistors T1 to T7 of the pixel PX are shown. In FIG. 5A, the scan lines SLi−1, SLi, and SLi+1, the i-th light emitting control line ECLi, and the second power line VL are shown. FIG. 5A shows a stacked structure from the base layer BL to a fifth conductive layer DMP2.

Referring to FIG. 6A, the circuit layer CL may include a first buffer layer BFL1, a second buffer layer BFL2, a first insulating layer GI1, a second insulating layer GI2, a third insulating layer ILD1, a fourth insulating layer ILD2, a fifth insulating layer VIA1, a sixth insulating layer VIA2, a semiconductor pattern ACP including a plurality of patterns, a first conductive layer GMP1 including a plurality of patterns, a second conductive layer GMP2 including a plurality of patterns, the third conductive layer GMP3 including a plurality of patterns, a fourth conductive layer DMP1 including a plurality of patterns, and the fifth conductive layer DMP2 including a plurality of patterns.

The first to seventh transistors T1 to T7 of the pixel PX, the scan lines SLi−1, SLi, and SLi+1, the i-th light emitting control line ECLi, the first power line PL, and the second power line VL shown in FIG. 5A may be formed using or defined by the conductive patterns of the first, second, third, fourth, and fifth conductive layers GMP1, GMP2, GMP3, DMP1, and DMP2 and the semiconductor pattern ACP. FIG. 5A shows an exemplary embodiment where the fourth transistor T4 of the pixel PX includes two transistors connected to each other in series.

FIG. 5B shows a dummy line DDL included in the third conductive layer GMP3. The third conductive layer GMP3 may further include another conductive pattern. The dummy line DDL is a conductive pattern included in the third conductive layer GMP3, and the dummy line DDL is disposed to overlap some transistors, for instance, the fourth and seventh transistors T4 and T7, and blocks an external light incident to the transistors. In an exemplary embodiment of the disclosure, the dummy line DDL may prevent a voltage-current characteristic of the transistor from varying due to the external light.

In an alternative exemplary embodiment, the dummy line DDL may receive the initialization voltage and may be used as a power line.

In an exemplary embodiment, the first conductive layer GMP1 may be a first gate metal pattern, the second conductive layer GMP2 may be a second gate metal pattern, the third conductive layer GMP3 may be a third gate metal pattern, the fourth conductive layer DMP1 may be a first data metal pattern, and the fifth conductive layer DMP2 may be a second data metal pattern, but not being limited thereto or thereby.

In an exemplary embodiment of the disclosure, each of the first insulating layer GIL the second insulating layer GI2, the third insulating layer ILD1, and the fourth insulating layer ILD2 may include an organic layer and/or an inorganic layer. In such an embodiment, each of the first insulating layer GIL the second insulating layer GI2, the third insulating layer ILD1, and the fourth insulating layer ILD2 may include a plurality of inorganic thin layers. The inorganic thin layers may include a silicon nitride layer and a silicon oxide layer.

In an exemplary embodiment of the disclosure, each of the fifth insulating layer VIA1 and the sixth insulating layer VIA2 may include an organic material. In such an embodiment, each of the first gate metal pattern GMP1, the second gate metal pattern GMP2, and the third gate metal pattern GMP3 may include a first metal material. In an exemplary embodiment of the disclosure, each of the first gate metal pattern GMP1, the second gate metal pattern GMP2, and the third gate metal pattern GMP3 may have substantially the same resistance as each other. In one exemplary embodiment, for example, the first metal material may include molybdenum (Mo), but not being limited thereto or thereby.

In an exemplary embodiment of the disclosure, each of the first data metal pattern DMP1 and the second data metal pattern DMP2 may include a second metal material. The second metal material may be different from the first metal material. In one exemplary embodiment, for example, the second metal material may include at least one material selected from aluminum (Al) and titanium (Ti), but not being limited thereto or thereby. In an exemplary embodiment of the disclosure, each of the first data metal pattern DMP1 and the second data metal pattern DMP2 may have a stacked structure in which titanium, aluminum, and titanium are sequentially stacked one on another.

The first buffer layer BFL1 may be disposed on the base layer BL. The second buffer layer BFL2 may be disposed on the first buffer layer BFL1. Each of the first buffer layer BFL1 and the second buffer layer BFL2 may prevent a foreign substance existing in the base layer BL from entering the pixel PX. In such an embodiment, each of the first buffer layer BFL1 and the second buffer layer BFL2 may prevent the foreign substance from being diffused to the semiconductor pattern ACP of the transistors T1 to T7 of the pixel PX.

The foreign substance may be introduced from the outside or may be generated by a thermal decomposition of the base layer BL. The foreign substance may be gas or sodium discharged from the base layer BL. In such an embodiment, each of the first buffer layer BFL1 and the second buffer layer BFL2 may prevent moisture from entering the pixel PX from the outside. According to an alternative exemplary embodiment of the disclosure, at least one selected from the first buffer layer BFL1 and the second buffer layer BFL2 may be omitted.

The semiconductor pattern ACP may be disposed on the second buffer layer BFL2. The semiconductor pattern ACP may form each of the transistors T1 to T7. The semiconductor pattern ACP may include polysilicon, amorphous silicon, or metal oxide semiconductor. FIG. 6A shows the semiconductor pattern ACP forming a source S1, an active A1, and a drain D1 of the first transistor T1 and the semiconductor pattern ACP forming a source S2, an active A2, and a drain D2 of the second transistor T2.

In an exemplary embodiment, as shown in FIG. 6B, two semiconductor patterns ACP are spaced apart from each other. Alternatively, two semiconductor patterns ACP may be provided integrally with each other as a single unitary unit when viewed in a plan view as shown in FIG. 5A.

In an exemplary embodiment of the disclosure, the first insulating layer Gil may be disposed on the second buffer layer BFL2 and may cover the semiconductor pattern ACP. The source S1, the active A1, and the drain D1 of the first transistor T1 and the source S2, the active A2, and the drain D2 of the second transistor T2 may be disposed under the first insulating layer GI1. The first gate metal pattern GMP1 may be disposed on the first insulating layer GI1. The gate G1 of the first transistor T1 and the gate G2 of the second transistor T2 may be defined by the first gate metal pattern GMP1. Although not shown, in an exemplary embodiment of the disclosure, the first gate metal pattern GMP1 may define one of two electrodes that form the capacitor CP of the pixel PX.

The second insulating layer GI2 may be disposed on the first insulating layer GI1 and may cover the first gate metal pattern GMP1. The second gate metal pattern GMP2 may be disposed on the second insulating layer GI2. In an exemplary embodiment of the disclosure, the second gate metal pattern GMP2 may define the other electrode of the two electrodes that forms the capacitor CP. An upper electrode UE may be defined by the second gate metal pattern GMP2. An opening UE-OP may be defined through the upper electrode UE.

The third insulating layer ILD1 may be disposed on the second insulating layer GI2 and may cover the second gate metal pattern GMP2. The third gate metal pattern GMP3 may be disposed on the third insulating layer ILD1. Two connection electrodes CNE-G3 may be defined by the third gate metal pattern GMP3.

One of the two connection electrodes CNE-G3 may be connected to the gate G1 of the first transistor T1 via a contact hole CH10 defined through the second insulating layer GI2 and the third insulating layer ILD1. The contact hole CH10 may extend through the opening UE-OP.

The other of the two connection electrodes CNE-G3 may be connected to the source S2 of the second transistor T2 via a contact hole CH20 defined through the first insulating layer GIL the second insulating layer GI2 and the third insulating layer ILD1.

The fourth insulating layer ILD2 may be disposed on the third insulating layer ILD1 and may cover the third gate metal pattern GMP3. The first data metal pattern DMP1 may be disposed on the fourth insulating layer ILD2. A connection electrode CNE-D1 is defined by the first data metal pattern DMP1. The connection electrode CNE-D1 of the first data metal pattern DMP1 may be connected to a corresponding one of the two connection electrodes CNE-G3 via a contact hole CH21 defined through the fourth insulating layer ILD2. In an alternative exemplary embodiment of the disclosure, the connection electrodes CNE-G3 of the third gate metal pattern GMP3 may be omitted, and, in such an embodiment, the connection electrode CNE-D1 of the first data metal pattern DMP1 may be connected to the gate G1 of the first transistor T1 or the source S2 of the second transistor T2.

The fifth insulating layer VIA1 may be disposed on the fourth insulating layer ILD2 and may cover the first data metal pattern DMP1. The second data metal pattern DMP2 may be disposed on the fifth insulating layer VIAL A connection electrode CNE-D2 is defined by the second data metal pattern DMP2. The connection electrode CNE-D2 of the second data metal pattern DMP2 may be connected to a corresponding connection electrode CNE-D1 of the first data metal pattern DMP1 via a contact hole CH22 defined through the fifth insulating layer VIAL The sixth insulating layer VIA2 may be disposed on the fifth insulating layer VIA1 and may cover the second data metal pattern DMP2. The light emitting element layer ELL may include the light emitting element LD and a pixel definition layer PDL. The light emitting element LD may include the anode electrode AE, a light emitting layer EML, and a cathode electrode CE.

The anode electrode AE may be disposed on the sixth insulating layer VIA2. The anode electrode AE may be electrically connected to the second data metal pattern DMP2 through a contact hole (not shown in FIG. 6A and FIG. 6B). The pixel definition layer PDL may be disposed on the sixth insulating layer VIA2, and at least a portion of the anode electrode AE may be exposed without being covered by the pixel definition layer PDL. The light emitting layer EML may be disposed on the anode electrode AE. The cathode electrode CE may be disposed on the light emitting layer EML.

In an exemplary embodiment, where the light emitting element LD is an organic light emitting diode ("OLED"), the light emitting layer EML may include an organic material. According to an alternative exemplary embodiment of the disclosure, where the light emitting element LD is the micro light emitting diode ("LED"), the light emitting layer EML may include an inorganic material. The encapsulation layer TFE may encapsulate the light emitting element layer ELL to protect the light emitting element layer ELL from external oxygen or moisture. The encapsulation layer TFE may be a layer obtained by combining an organic layer with an inorganic layer.

In an exemplary embodiment, as shown in FIG. 6B, a connection line LNC may be disposed in a predetermined area of the non-active area NACA. The connection line LNC may be define by the second data metal pattern DMP2. In such an embodiment, as described above, the second data metal pattern DMP2 may be disposed on the fifth insulating layer VIAL. Accordingly, the connection line LNC may be disposed on the fifth insulating layer VIA1.

In an exemplary embodiment, the first buffer layer BFL1, the second buffer layer BFL2, the first insulating layer GI1, the second insulating layer GI2, the third insulating layer ILD1, and the fourth insulating layer ILD2 may not be disposed in a portion corresponding to the bending area BA. An opening OP may be defined through the first buffer layer BFL1, the second buffer layer BFL2, the first insulating layer GI1, the second insulating layer GI2, the third insulating layer ILD1, and the fourth insulating layer ILD2.

FIGS. 6A and 6B show an exemplary embodiment where the opening OP is formed through the first buffer layer BFL1 to the fourth insulating layer ILD2 to overlap the bending area BA. In such an embodiment, the opening OP is formed in the form of two steps or formed through two processes. In such an embodiment where the opening OP is formed in the form of two steps, an inclined surface that defines the opening OP is stepped.

In an exemplary embodiment, as described above, as only the fifth insulating layer VIA1 and the sixth insulating layer VIA2 are provided on the portion corresponding to the bending area BA, a flexibility of the bending area BA may be improved.

Figure 7A:
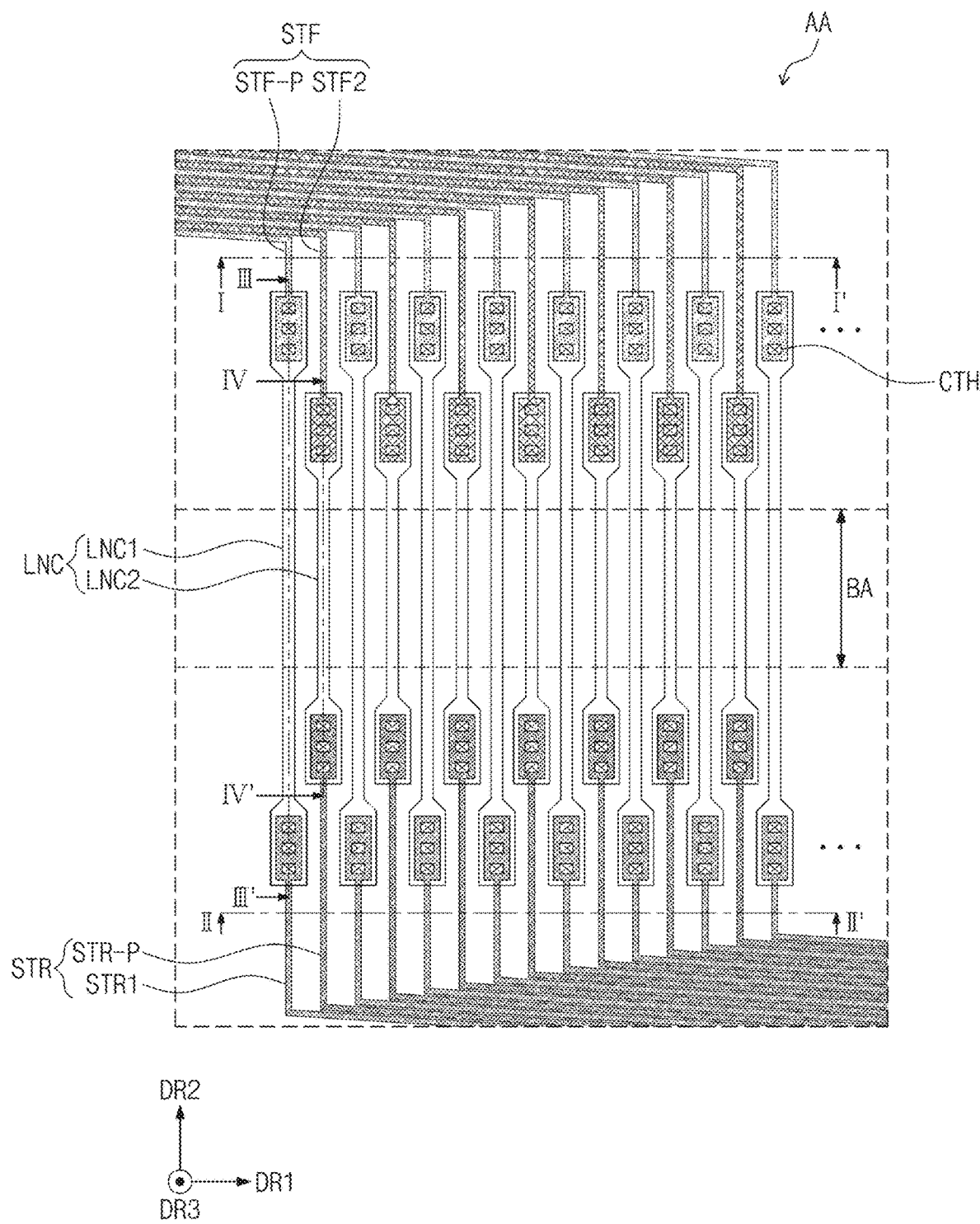
FIG. 7A is an enlarged view showing an area AA of FIG. 2A.
Figure 7B:
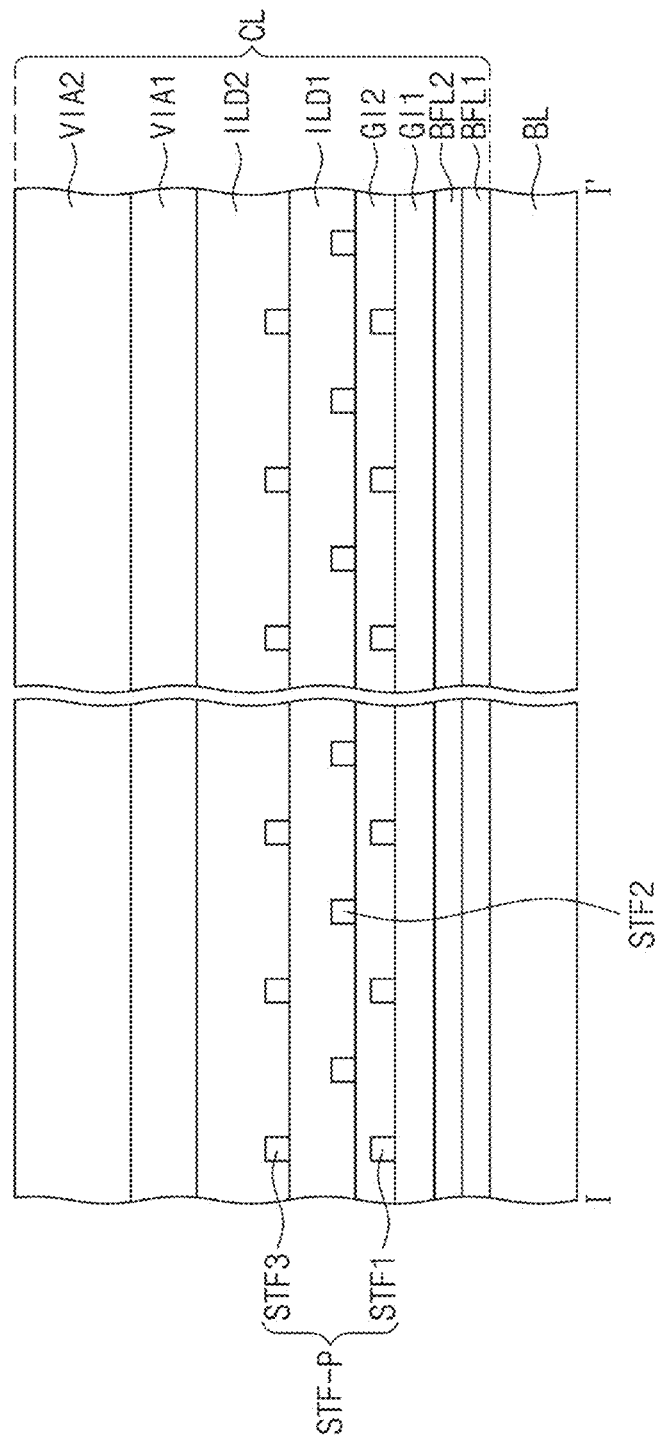
FIG. 7B is a cross-sectional view taken along line I-I' of FIG. 7A.
Figure 7C:
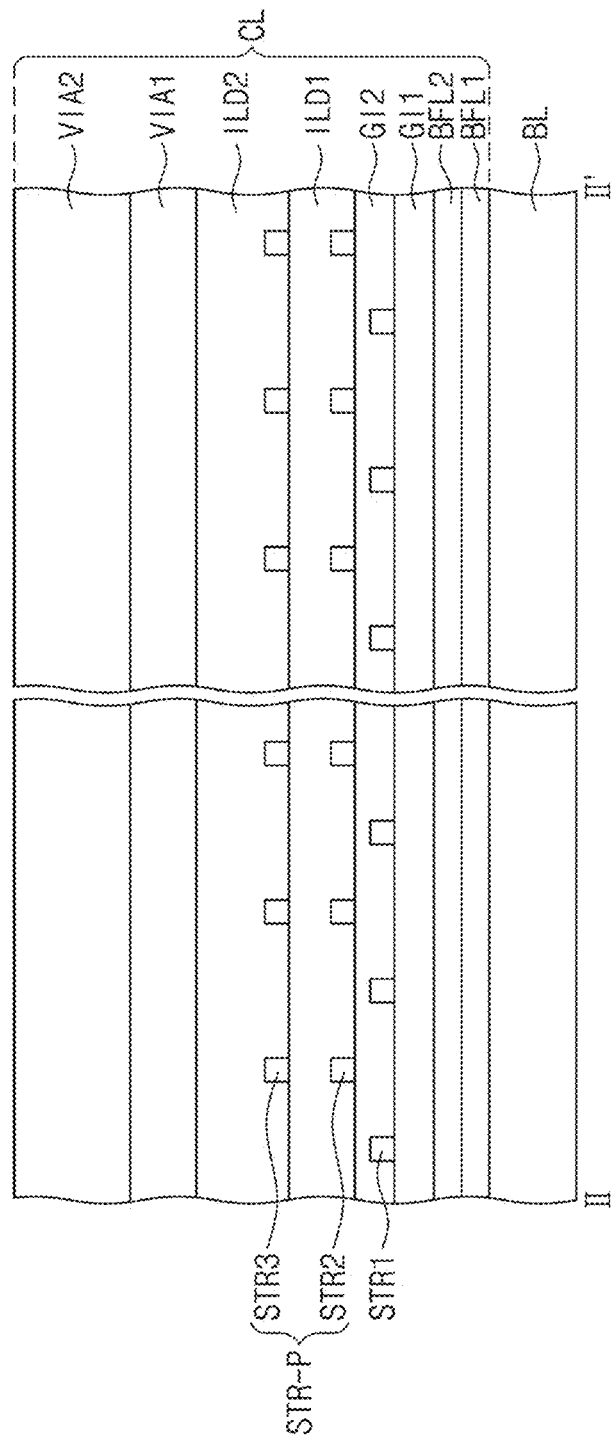
FIG. 7C is a cross-sectional view taken along line II-II' of FIG. 7A.
Figure 7D:
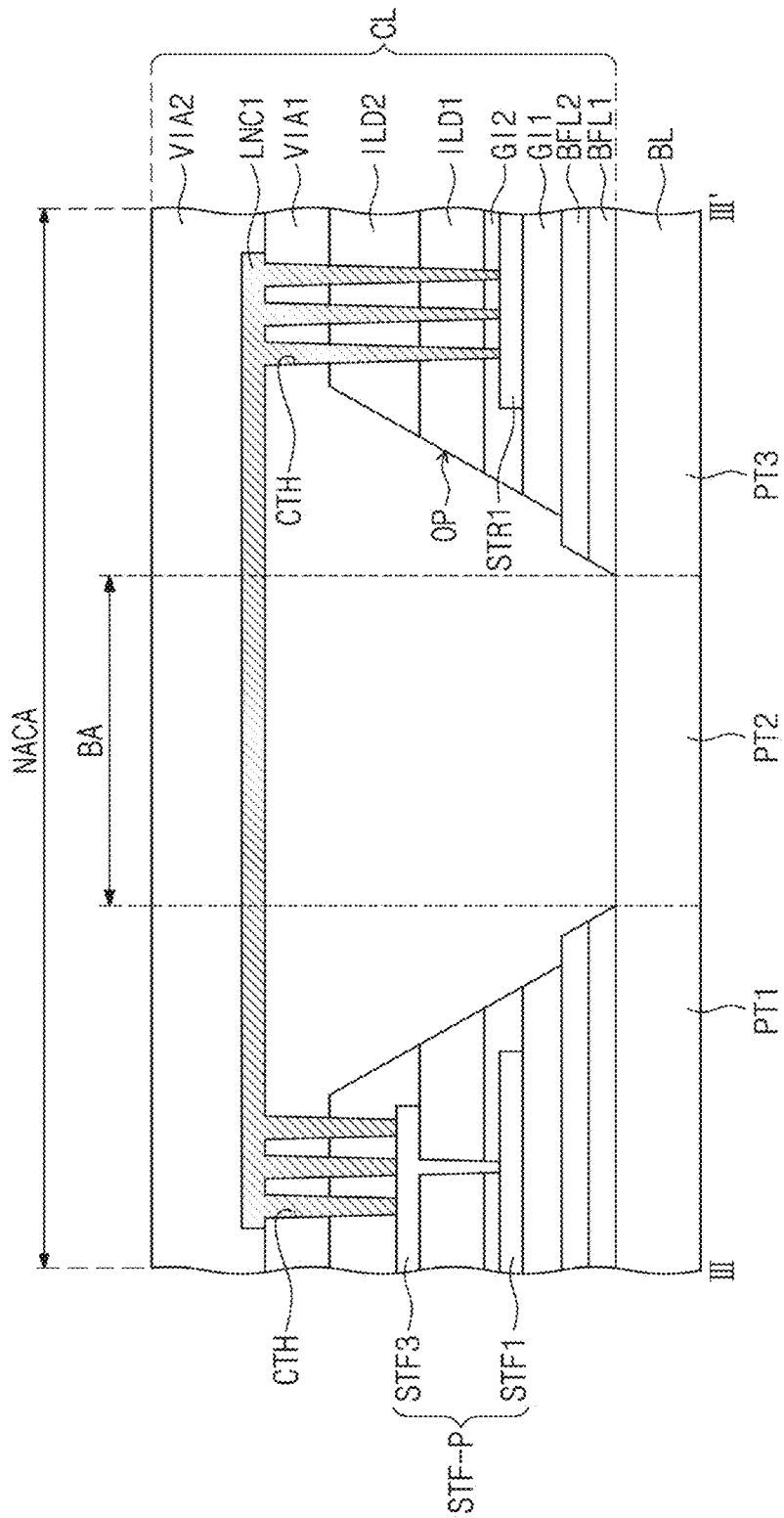
FIGS. 7D and 7E are cross-sectional views taken along line III-III' of FIG. 7A.
Figure 7E:
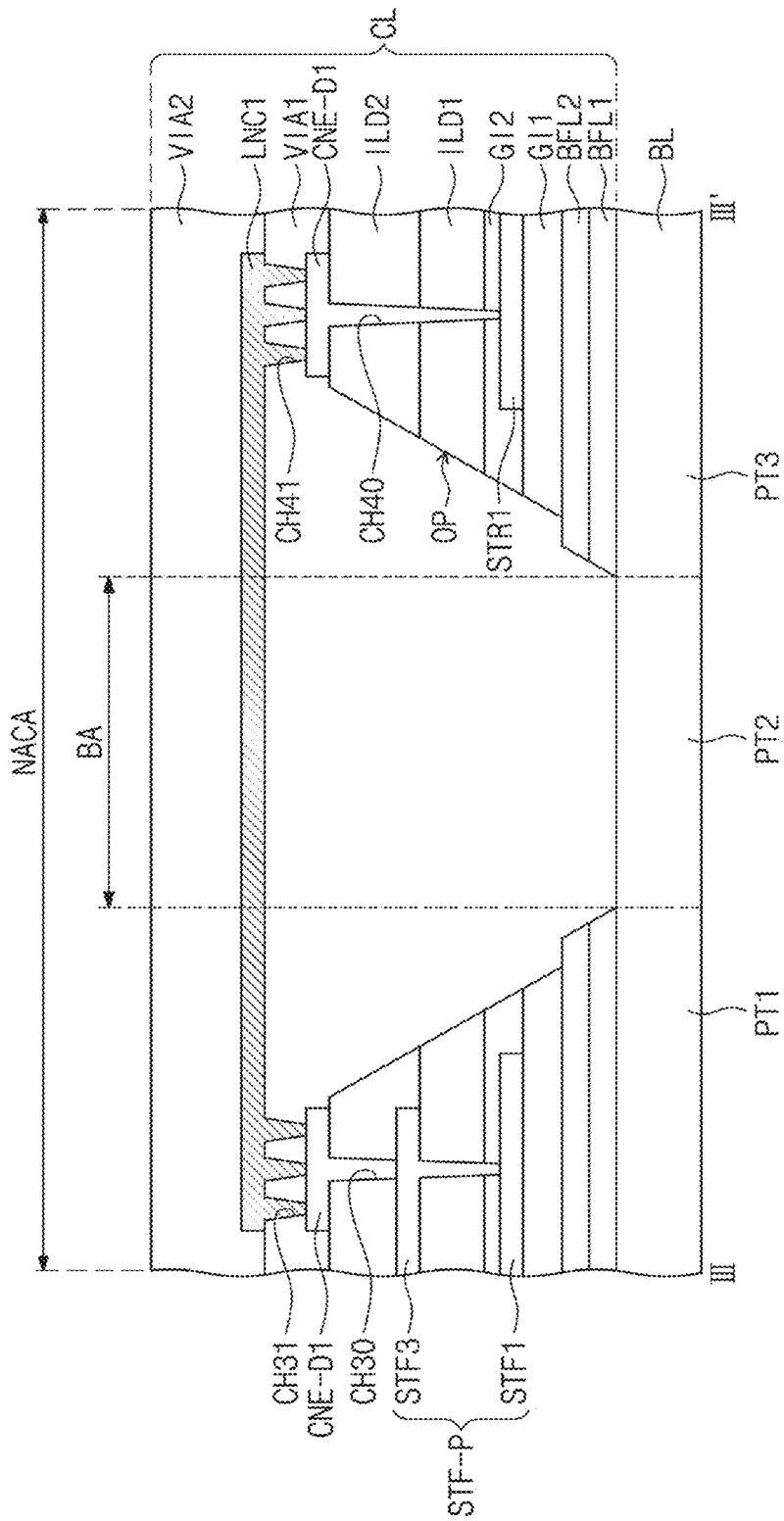
Figure 7F:
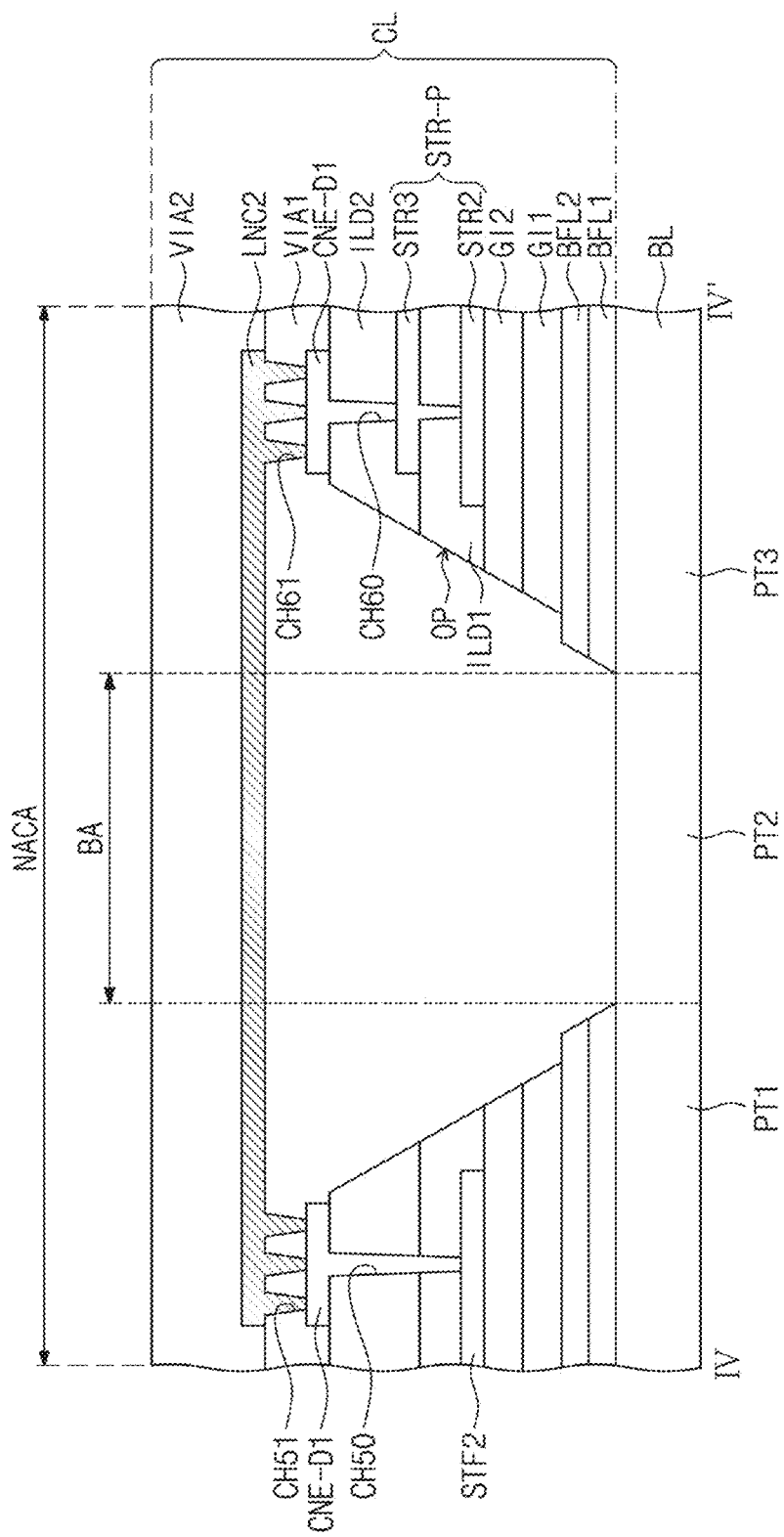
FIG. 7F is a cross-sectional view taken along line IV-IV' of FIG. 7A.

FIG. 7A is an enlarged view showing an area AA of FIG. 2A. FIG. 7B is a cross-sectional view taken along line I-I' of FIG. 7A. FIG. 7C is a cross-sectional view taken along line II-IP of FIG. 7A. FIGS. 7D and 7E are cross-sectional views taken along line III-III' of FIG. 7A. FIG. 7F is a cross-sectional view taken along line IV-IV' of FIG. 7A. FIGS. 8A, 8B, 8C, and 8D are plan views showing lines shown in FIG. 7A, layer by layer.

In an exemplary embodiment, a front signal line STF may be disposed on the first portion PT1 of the base layer BL. The front signal line STF may be electrically connected to the light emitting element LD of the light emitting element layer ELL. In such an embodiment, the front signal line STF may be electrically connected to the pixels PX, each including the light emitting element LD.

In an exemplary embodiment, the front signal line STF may include a first layer front signal line STF1, a second layer front signal line STF2, and a third layer front signal line STF3. The first layer front signal line STF1, the second layer front signal line STF2, and the third layer front signal line STF3 may be disposed in different layers from each other.

In an exemplary embodiment, the first layer front signal line STF1 may be disposed at a first position. The second layer front signal line STF2 may be disposed at a second position. The third layer front signal line STF3 may be disposed at a third position. In such an embodiment, the first position may be defined between the first insulating layer GI1 and the second insulating layer GI2, the second position may be defined between the second insulating layer GI2 and the third insulating layer ILD1, and the third position may be defined between the third insulating layer ILD1 and the fourth insulating layer ILD2.

In an exemplary embodiment, the first layer front signal line STF1 disposed at the first position may be formed through a same process as the first gate metal pattern GMP1 disposed on the first insulating layer GI1. The second layer front signal line STF2 disposed at the second position may be formed through a same process as the second gate metal pattern GMP2 disposed on the second insulating layer GI2. The third layer front signal line STF3 disposed at the third position may be formed through a same process as the third gate metal pattern GMP3 disposed on the third insulating layer ILD1. However, the disclosure is not limited thereto or thereby.

Herein, the portion on which the front signal line STF is disposed may be referred to as a "spider line part".

In an exemplary embodiment, a rear signal line STR may be disposed on the third portion PT3 of the base layer BL. The rear signal line STR may be electrically connected to the data driving circuit DIC. The rear signal line STR may include a first layer rear signal line STR1, a second layer rear signal line STR2, and a third layer rear signal line STR3. The first layer rear signal line STR1, the second layer rear signal line STR2, and the third layer rear signal line STR3 may be disposed in different layers from each other. The first layer rear signal line STR1 may be disposed at the first position. The second layer rear signal line STR2 may be disposed at the second position. The third layer rear signal line STR3 may be disposed at the third position. In such an embodiment, as described above, the first position may be defined between the first insulating layer GI1 and the second insulating layer GI2, the second position may be defined between the second insulating layer GI2 and the third insulating layer ILD1, and the third position may be defined between the third insulating layer ILD1 and the fourth insulating layer ILD2.

The connection line LNC may be disposed on the first portion PT1 to the third portion PT3 of the base layer BL. The connection line LNC may electrically connect the front signal line STF and the rear signal line STR. In an exemplary embodiment, the connection line LNC may be disposed in a layer different from a layer in which the front signal line STF and the rear signal line STR are disposed. In one exemplary embodiment, for example, the connection line LNC may be disposed on the fifth insulating layer VIA1 as described above. The second portion PT2 on which the connection line LNC is disposed may be the bending area BA.

In an exemplary embodiment of the disclosure, each of the front signal line STF and the rear signal line STR may include the first metal material, and the connection line LNC may include the second metal material. In an exemplary embodiment of the disclosure, the first metal material may have a first specific resistance different from a second specific resistance of the second metal material. In an exemplary embodiment of the disclosure, the first metal material may include molybdenum (Mo). In an exemplary embodiment of the disclosure, the second metal material may include aluminum (Al) and titanium (Ti).

In an exemplary embodiment of the disclosure, the light emitting element LD may include a plurality of light emitting elements. The light emitting element LD may include a first light emitting element (not shown) and a second light emitting element (not shown). The first light emitting element and the second light emitting element may be arranged in a same pixel row.

A first front signal line and a second front signal line may be electrically connected to the first light emitting element. A third front signal line may be electrically connected to the second light emitting element.

In an exemplary embodiment, the first front signal line may be the first layer front signal line STF1. In an exemplary embodiment, the second front signal line may be the third layer front signal line STF3. The third front signal line may be the second layer front signal line STF2. Hereinafter, the first layer front signal line STF1, the third layer front signal line STF3 and the second layer front signal line STF2 will be referred to as the first front signal line, the second front signal line and the third front signal line, respectively, and the first front signal line, the second front signal line and the third front signal line will be labeled with same reference characters as the first layer front signal line STF1, the third layer front signal line STF3 and the second layer front signal line STF2, respectively.

In an exemplary embodiment, as shown in FIG. 7B, the first front signal line STF1, the second front signal line STF3, and the third front signal line STF2 may be disposed in different layers from each other.

The second front signal line STF3 may overlap the first front signal line STF1 in a thickness direction of the base layer BL, and may be electrically connected to the first front signal line STF1. A signal line defined by the first front signal line STF1 and the second front signal line STF3, which overlap and are electrically connected to each other, will be referred to as a front coupling signal line STF-P.

Referring back to FIG. 7A, the front coupling signal line STF-P may be electrically connected to a first connection line LNC1. In such an embodiment, each of the first front signal line STF1 and the second front signal line STF3 may be connected to the first connection line LNC1. The third front signal line STF2 may be electrically connected to a second connection line LNC2. The first connection line LNC1 may be electrically connected to the first light emitting element via the front coupling signal line STF-P. The second connection line LNC2 may be electrically connected to the second light emitting element via the third front signal line STF2.

In an alternative exemplary embodiment, while not illustrated, the front coupling signal line STF-P, the third front signal line STF2, a fourth front signal line and a fifth front signal line may be disposed along the first direction DR1 in FIG. 7A.

Features of the fourth front signal line may be the same as those of the first front signal line STF1 described above, and any repetitive detailed description thereof will be omitted.

Features of the fifth front signal line may be the same as those of the second front signal line STF3 described above, and any repetitive detailed description thereof will be omitted.

In such an embodiment, the fourth front signal line and the fifth front signal line may be connected in parallel to form the front coupling signal line STF-P.

In an exemplary embodiment, a third connection line may be electrically connected to both the fourth front signal line and the fifth front end signal line. Hereinafter, the first to third front signal lines (STF1, STF2, and STF3) will be mainly described.

In an exemplary embodiment, a first rear signal line may be electrically connected to the first connection line LNC1. In an exemplary embodiment, the first rear signal line may be the first layer rear signal line STR1. A first rear coupling signal line STR-P may be electrically connected to the second connection line LNC2. The first rear coupling signal line STR-P may be defined by a second rear signal line and a third rear signal line, which overlap and are electrically connected to each other. In an exemplary embodiment, the second rear signal line may be the second layer rear signal line STR2. The third rear signal line may be the third layer rear signal line STR3. Hereinafter, the first, second and third layer rear signal lines STR1, STR2, and STR3 will be referred to as the first, second and third rear signal lines, respectively, and the first, second and third rear signal lines will be labeled with the same reference characters as the first, second and third layer rear signal lines STR1, STR2, and STR3.

In an exemplary embodiment, as shown in FIG. 7C, the first rear signal line STR1, the second rear signal line STR2, and the third rear signal line STR3 may be disposed in different layers from each other.

The third rear signal line STR3 may overlap the second rear signal line STR2 and may be electrically connected to the second rear signal line STR2. A signal line defined by the second rear signal line STR2 and the third rear signal line STR3, which overlap and are electrically connected to each other, will be referred to as the first rear coupling signal line STR-P.

However, the disclosure is not limited thereto or thereby. In an alternative exemplary embodiment, a fourth rear signal line may be connected in parallel to the first rear signal line STR1. In such an embodiment, features of the fourth rear signal line may be the same as those of the third rear signal line STR3 described above, and any repetitive detailed description thereof will be omitted.

Referring to FIG. 7D, in an exemplary embodiment, the first connection line LNC1 may electrically connect the front coupling signal line STF-P to the first rear signal line STR1 spaced apart from the front coupling signal line STF-P by the opening OP. The front coupling signal line STF-P may be obtained by connecting the first front signal line STF1 to the second front signal line STF3 in parallel. The first connection line LNC1 may be connected to each of the front coupling signal line STF-P and the first rear signal line STR1 through a contact hole CTH. The contact hole CTH, through which the first connection line LNC1 is connected to the front coupling signal line STF-P, may be defined through from the fourth insulating layer ILD2 to the fifth insulating layer VIAL The contact hole CTH, through which the first connection line LNC1 is connected to the first rear signal line STR1, may be defined through from the second insulating layer GI2 to the fifth insulating layer VIA1.

However, the disclosure is not be limited thereto or thereby. Referring to FIG. 7E, in an alternative exemplary embodiment, the first connection line LNC1 may be connected to the front coupling signal line STF-P and the first rear signal line STR1 through two connection electrodes CNE-D1, respectively.

In such an embodiment, the first connection line LNC1 may be connected to two connection electrodes CNE-D1 through contact holes CH31 and CH41. One of the two connection electrodes CNE-D1 may be connected to the second front signal line STF3 through a contact hole CH30 defined through the fourth insulating layer ILD2. The other of the two connection electrodes CNE-D1 may be connected to the first rear signal line STR1 through a contact hole CH40 defined through the second insulating layer GI2 to the fourth insulating layer ILD2.

Referring to FIG. 7F, the second connection line LNC2 may connect the third front signal line STF2 to the first rear coupling signal line STR-P spaced apart from the third front signal line STF2 by the opening OP. The first rear coupling signal line STR-P may be obtained by connecting the second rear signal line STR2 to the third rear signal line STR3 in parallel.

The second connection line LNC2 may be connected to each of the third front signal line STF2 and the first rear coupling signal line STR-P through two connection electrodes CNE-D1. In such an embodiment, the second connection line LNC2 may be connected to the two connection electrodes CNE-D1 through contact holes CH51 and CH61.

One of the two connection electrodes CNE-D1 may be electrically connected to the third front signal line STF2 through a contact hole CH50 defined through the third insulating layer ILD1 and the fourth insulating layer ILD2. The other of the two connection electrodes CNE-D1 may be electrically connected to the third rear signal line STR3 through a contact hole CH60 defined through the fourth insulating layer ILD2. However, the disclosure is not limited thereto or thereby. Alternatively, the two connection electrodes CNE-D1 may be omitted, and the connection electrode CNE-D1 may be replaced with the contact holes CH51 and CH61 of the second connection line LNC2. The number of the contact holes CH30, CH31, CH40, CH41, CH50, CH51, CH60, and CH61 are not be particularly limited and may be singular or plural.

In FIGS. 8A to 8D, the signal lines STF and STR including the first layer front signal line STF1 to the third layer front signal line STF3 and the first layer rear signal line STR1 to the third layer rear signal line STR3 are illustrated to layer by layer. Features of the first layer front signal line STF1 to the third layer front signal line STF3 and the first layer rear signal line STR1 to the third layer rear signal line STR3 may be the same as those described above.

Figure 8A:
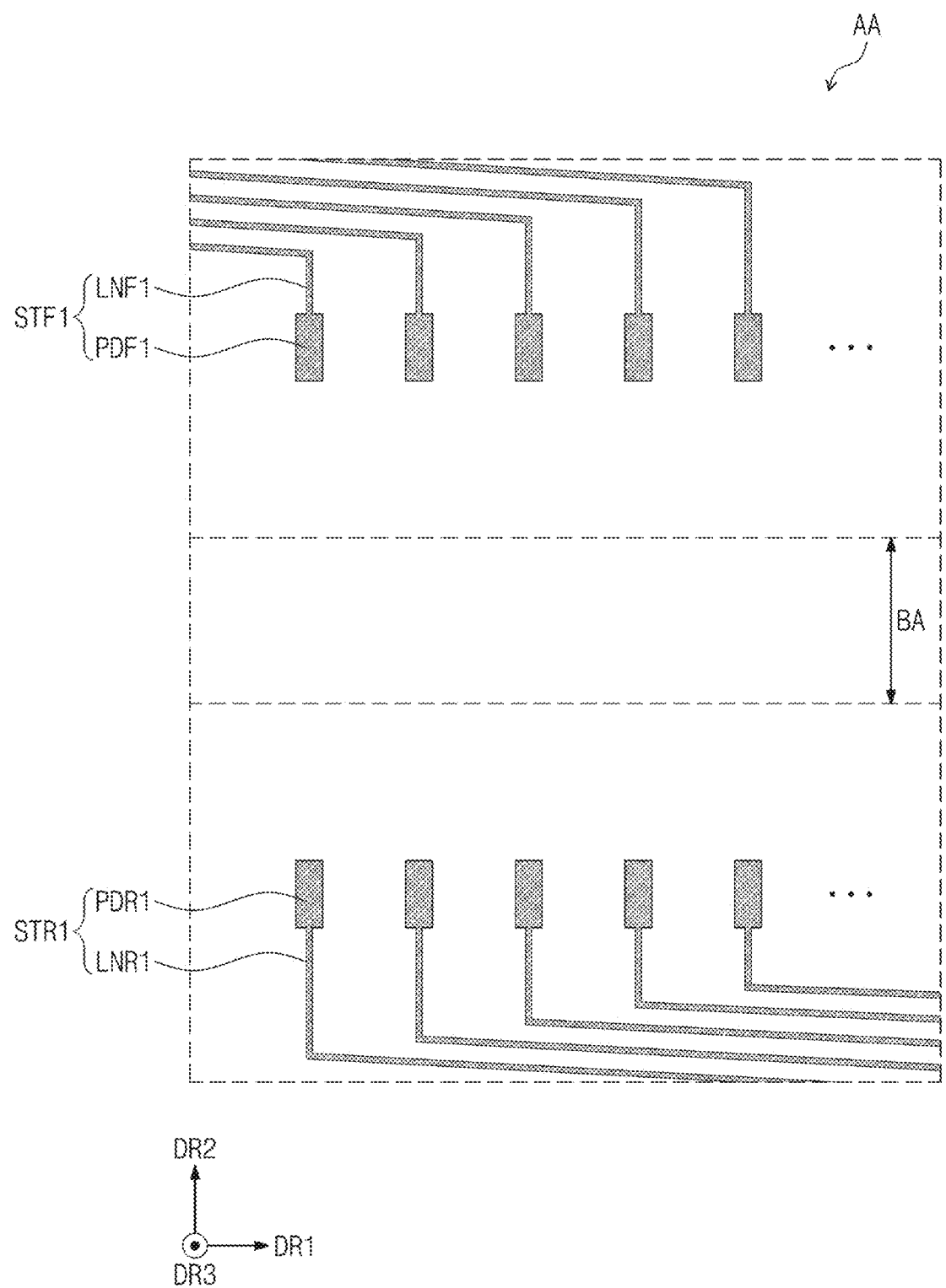
FIGS. 8A, 8B, 8C, and 8D are plan views showing lines shown in FIG. 7A, layer by layer.

Referring to FIG. 8A, the first layer front signal line STF1 and the first layer rear signal line STR1 may be disposed in a same layer as each other. In an exemplary embodiment of the disclosure, the first layer front signal line STF1 and the first layer rear signal line STR1 may be disposed in a same layer as the first gate metal pattern GMP1.

The first layer front signal line STF1 may include a line part LNF1 and a pad part PDF1. The first layer rear signal line STR1 may include a line part LNR1 and a pad part PDR1.

Figure 8B:
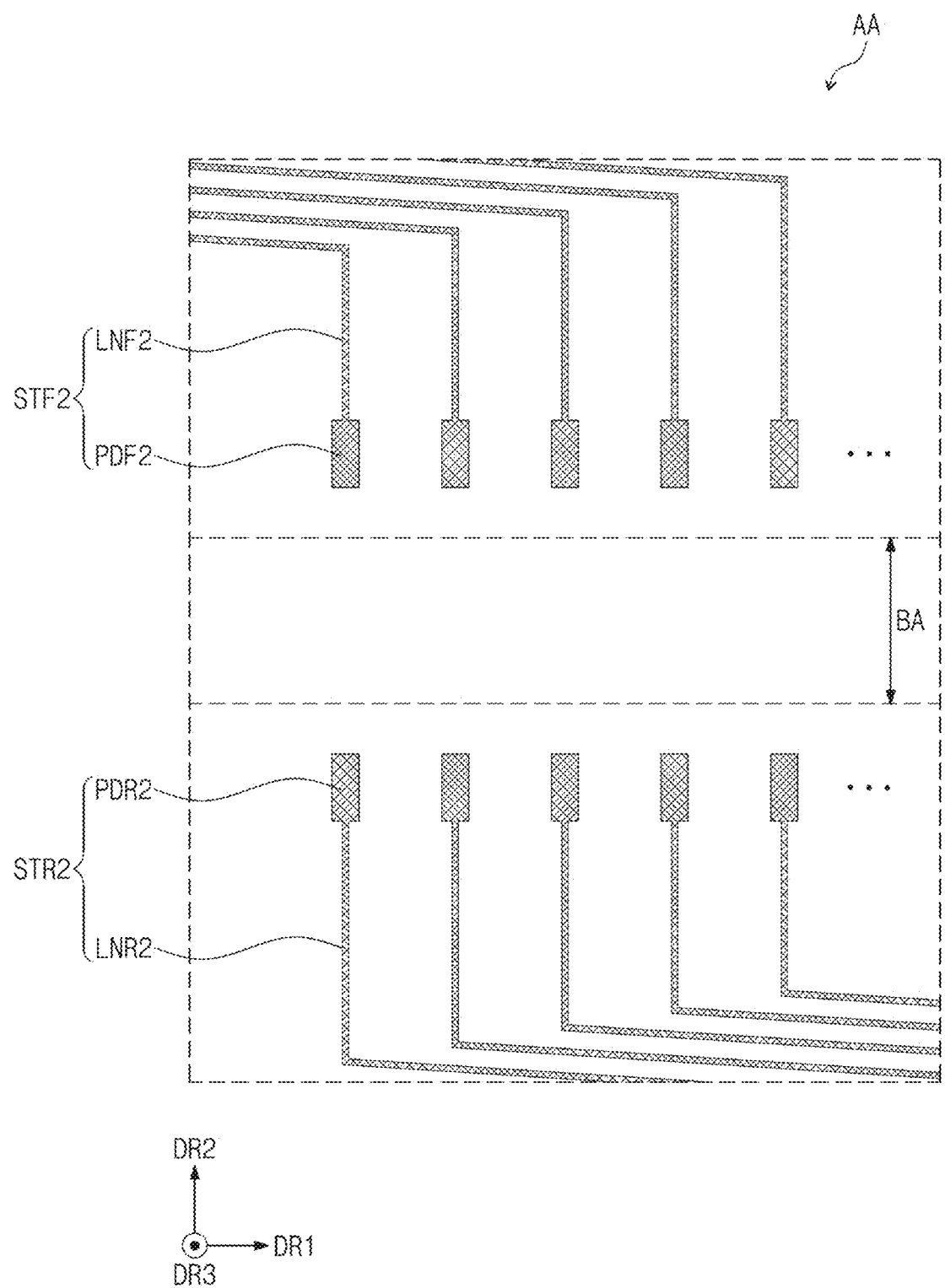

Referring to FIG. 8B, the second layer front signal line STF2 and the second layer rear signal line STR2 may be disposed in a same layer as each other. In an exemplary embodiment of the disclosure, the second layer front signal line STF2 and the second layer rear signal line STR2 may be disposed in a same layer as the second gate metal pattern GMP2.

The second layer front signal line STF2 may include a line part LNF2 and a pad part PDF2. The second layer rear signal line STR2 may include a line part LNR2 and a pad part PDR2.

Figure 8C:
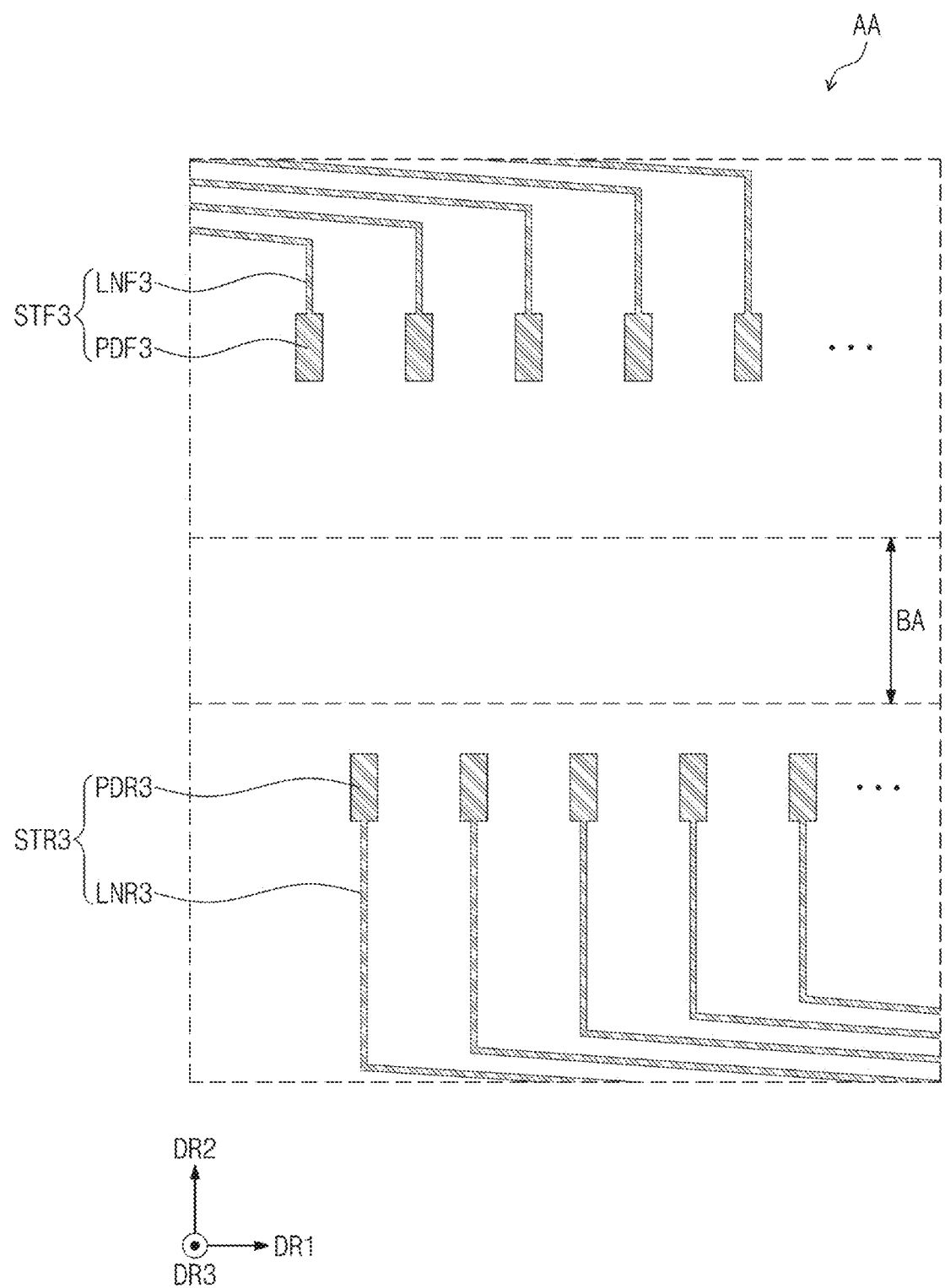

Referring to FIG. 8C, the third layer front signal line STF3 and the third layer rear signal line STR3 may be disposed in a same layer as each other. In an exemplary embodiment of the disclosure, the third layer front signal line STF3 and the third layer rear signal line STR3 may be disposed in a same layer as the third gate metal pattern GMP3.

The third layer front signal line STF3 may include a line part LNF3 and a pad part PDF3. The third layer rear signal line STR3 may include a line part LNR3 and a pad part PDR3.

Figure 8D:
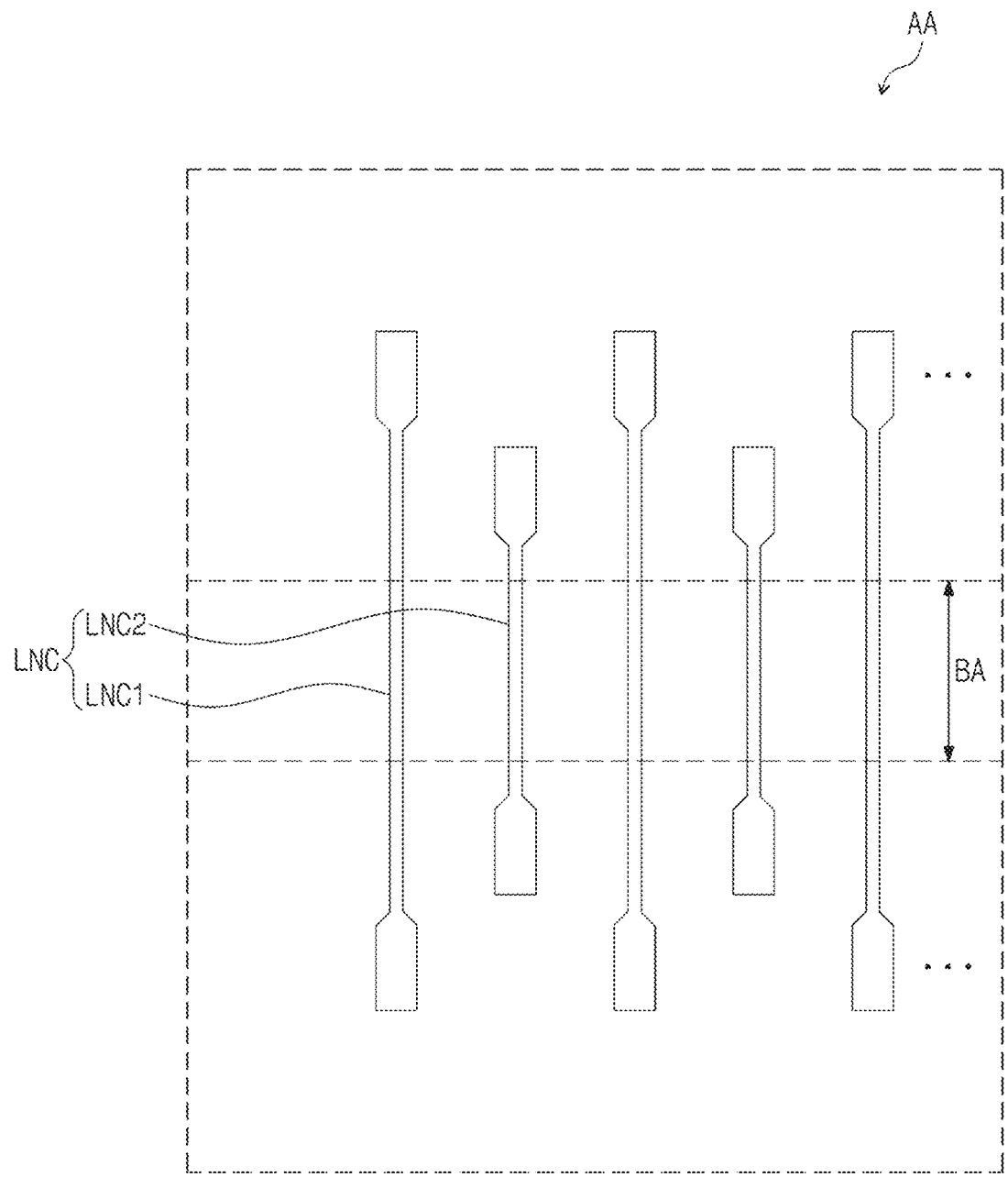

Referring to FIG. 8D, in an exemplary embodiment of the disclosure, the connection lines LNC1 and LNC2 may be disposed in a same layer as the second data metal pattern DMP2, but not being limited thereto or thereby.

Figure 9A:
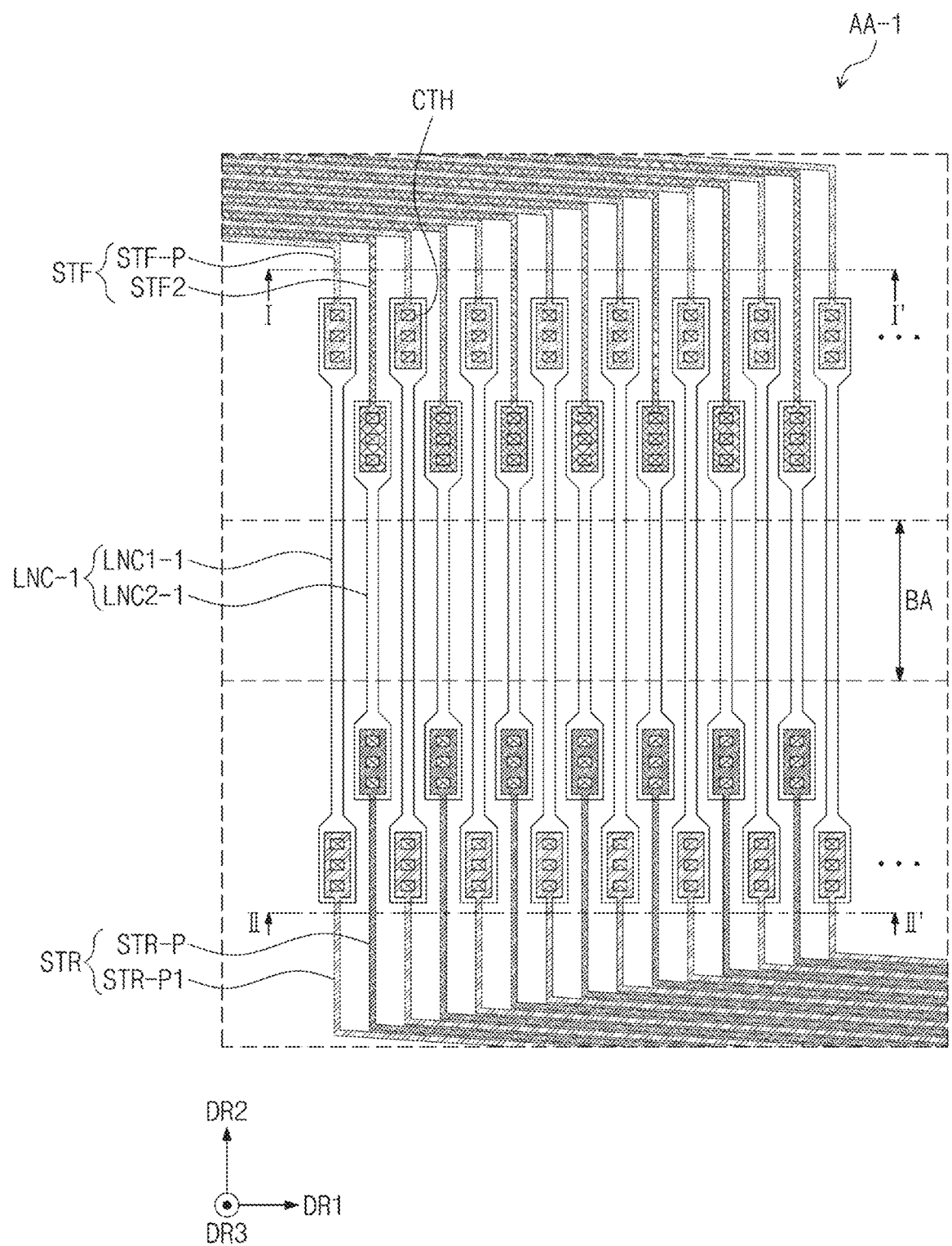
FIG. 9A is an enlarged plan view of an area AA-1 corresponding to the area AA of FIG. 2A according to an alternative exemplary embodiment of the disclosure.
Figure 9B:
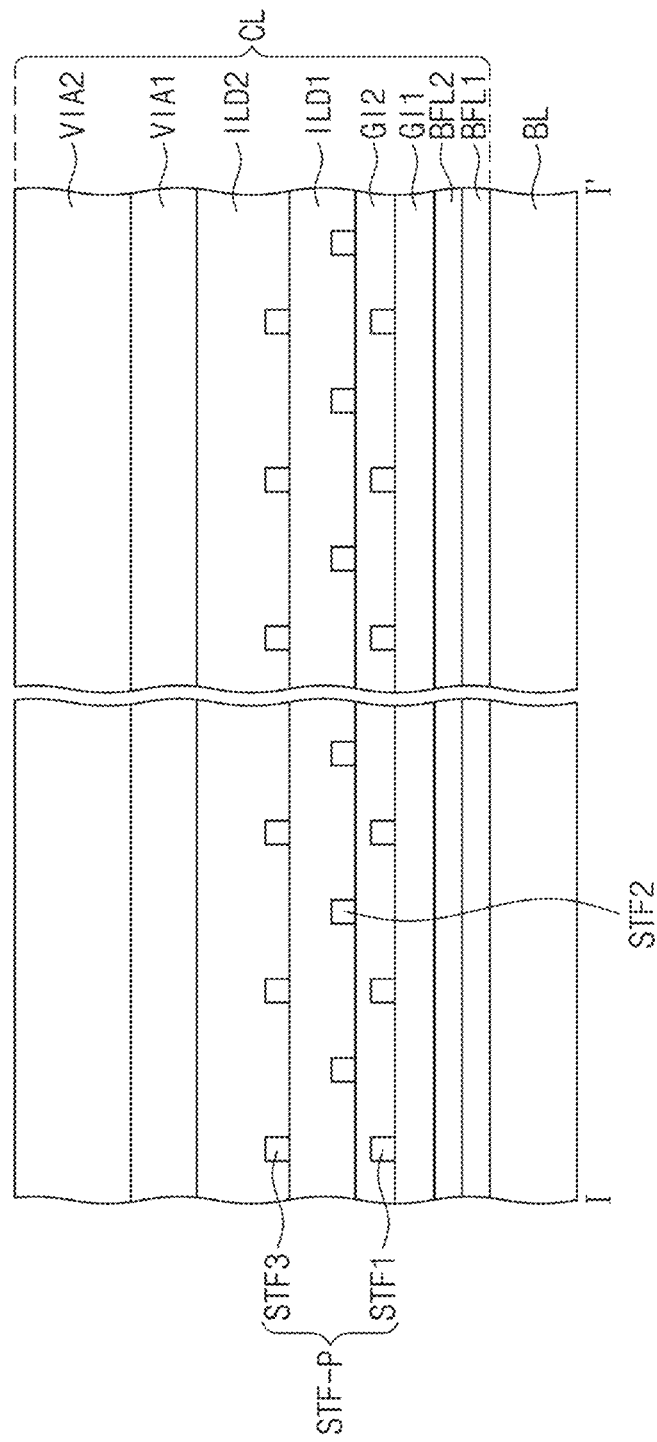
FIG. 9B is a cross-sectional view taken along line I-I' of FIG. 9A.
Figure 9C:
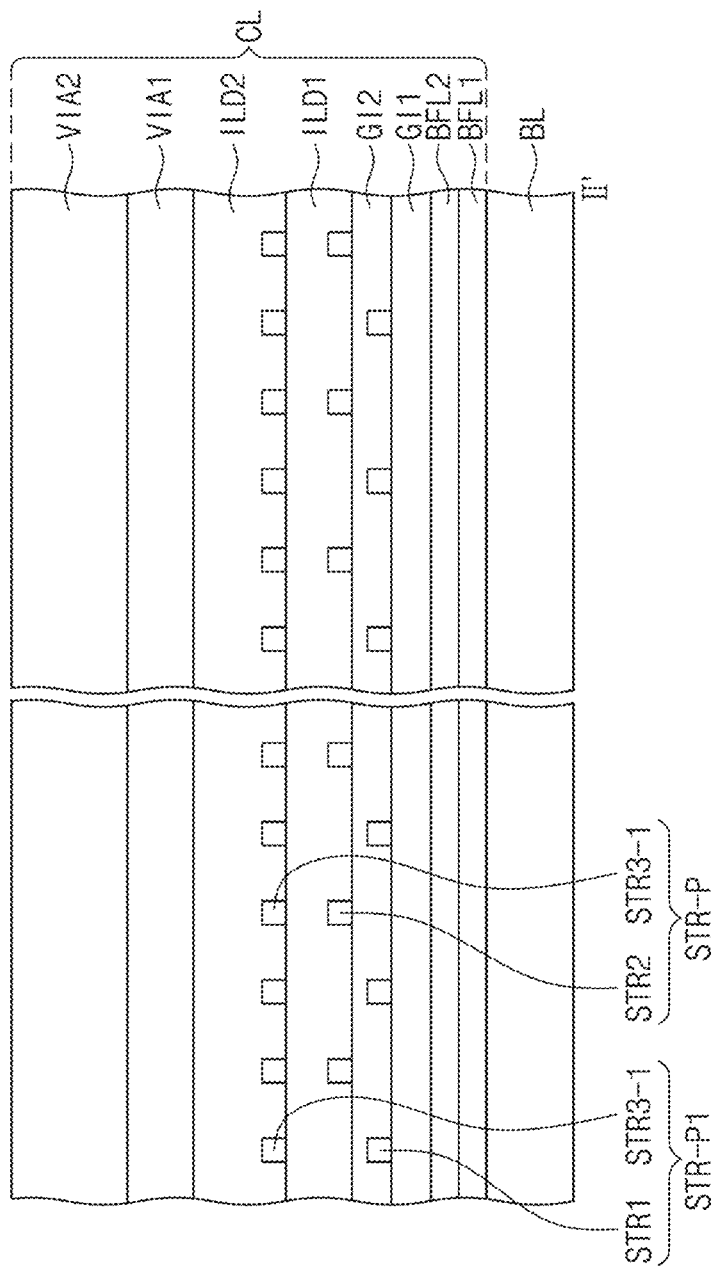
FIG. 9C is a cross-sectional view taken along line II-II' of FIG. 9A.

FIG. 9A is an enlarged plan view of an area AA-1 corresponding to the area AA of FIG. 2A according to an alternative exemplary embodiment of the disclosure. FIG. 9B is a cross-sectional view taken along line of FIG. 9A. FIG. 9C is a cross-sectional view taken along line II-IP of FIG. 9A. FIGS. 10A, 10B, 10C, and 10D are plan views showing lines shown in FIG. 9A layer by layer.

In an exemplary embodiment, a light emitting element LD may include a plurality of light emitting elements. In one exemplary embodiment, for example, the light emitting element LD may include a first light emitting element (not shown) and a second light emitting element (not shown). The first light emitting element and the second light emitting element may be arranged in a same pixel row.

In an exemplary embodiment, a front coupling signal line STF-P may be electrically connected to the first light emitting element. A third front signal line STF2 may be electrically connected to the second light emitting element. Features of the front coupling signal line STF-P and the third front signal line STF2 are the same as those described above with reference to FIGS. 7A to 8D, and any repetitive detailed description thereof will be omitted.

In such an embodiment, a first connection line LNC1-1 may be electrically connected to the front coupling signal line STF-P, and a second rear coupling signal line STR-P1 may be electrically connected to the first connection line LNC1-1. A second connection line LNC2-1 may be electrically connected to the third front signal line STF2, and a first rear coupling signal line STR-P may be electrically connected to the second connection line LNC 2-1.

Referring to FIG. 9B, the front coupling signal line STF-P may be defined by a first layer front signal line STF1 and a third layer front signal line STF3, which overlap and are electrically connected to each other.

Referring to FIG. 9C, the first rear coupling signal line STR-P may be defined by a second layer rear signal line STR2 and a third layer rear signal line STR3-1, which overlap and are electrically connected to each other. The second rear coupling signal line STR-P1 may be defined by a first layer rear signal line STR1 and the third layer rear signal line STR3-1, which overlap and are electrically connected to each other.

Each of the first rear coupling signal line STR-P and the second rear coupling signal line STR-P1 may be defined by two signal lines disposed to overlap each other. The first rear coupling signal line STR-P and the second rear coupling signal line STR-P1 may be disposed neighboring to each other in an area where there is enough space between signal lines on the non-active area NACA, and thus, a resistance between the lines may be reduced. Features of the first connection line LNC1-1 and the second connection line LNC2-1 may be substantially the same as those of the first connection line LNC1 and the second connection line LNC2 described above, and any repetitive detailed description thereof will be omitted.

Figure 10A:
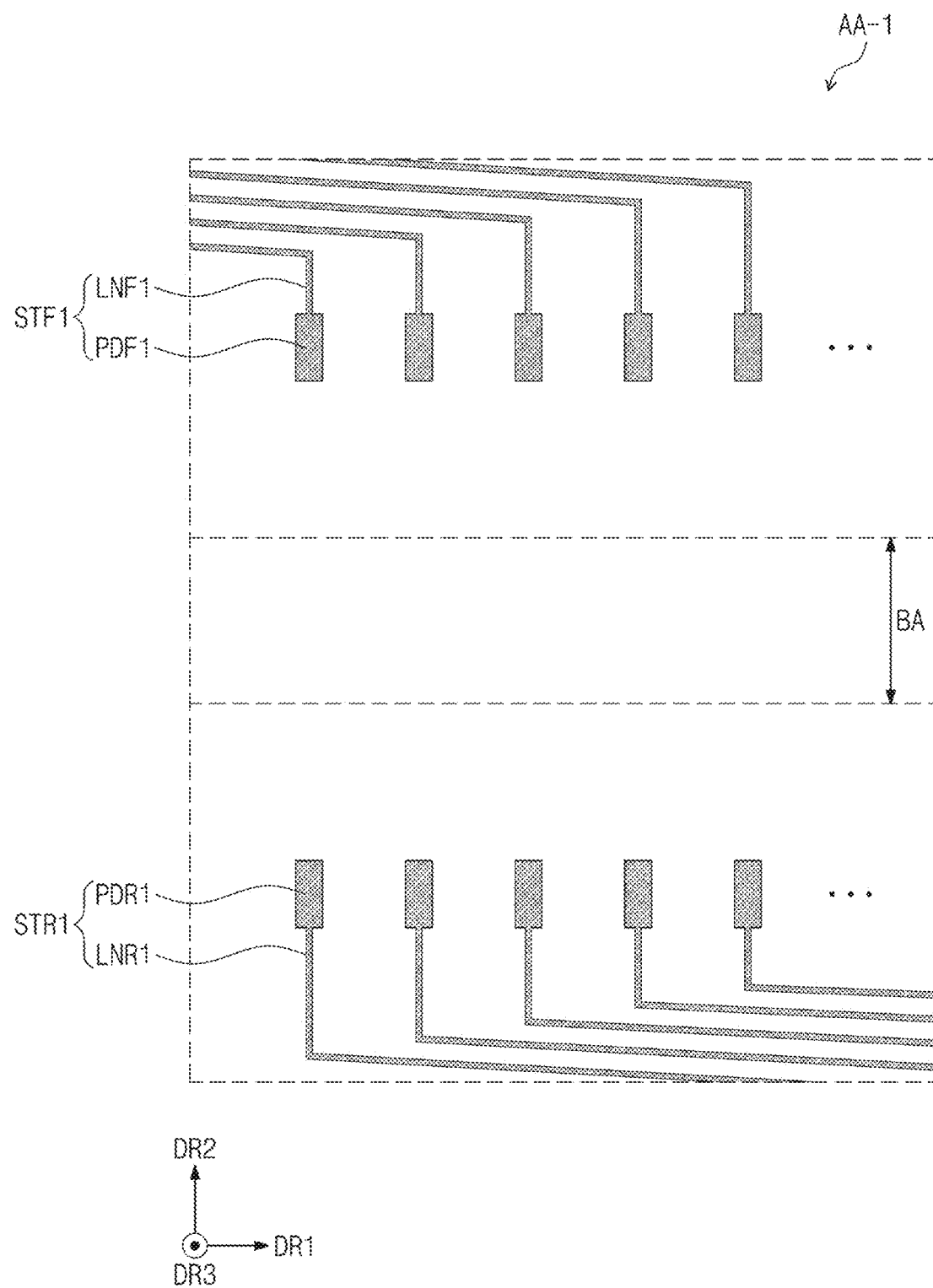
FIGS. 10A, 10B, 10C, and 10D are plan views showing lines shown in FIG. 9A layer by layer.

Referring to FIG. 10A, the first layer front signal line STF1 and the first layer rear signal line STR1 may be disposed in a same layer as each other. In an exemplary embodiment of the disclosure, the first layer front signal line STF1 and the first layer rear signal line STR1 may be disposed in a same layer as the first gate metal pattern GMP1.

The first layer front signal line STF1 may include a line part LNF1 and a pad part PDF1. The first layer rear signal line STR1 may include a line part LNR1 and a pad part PDR1.

Figure 10B:
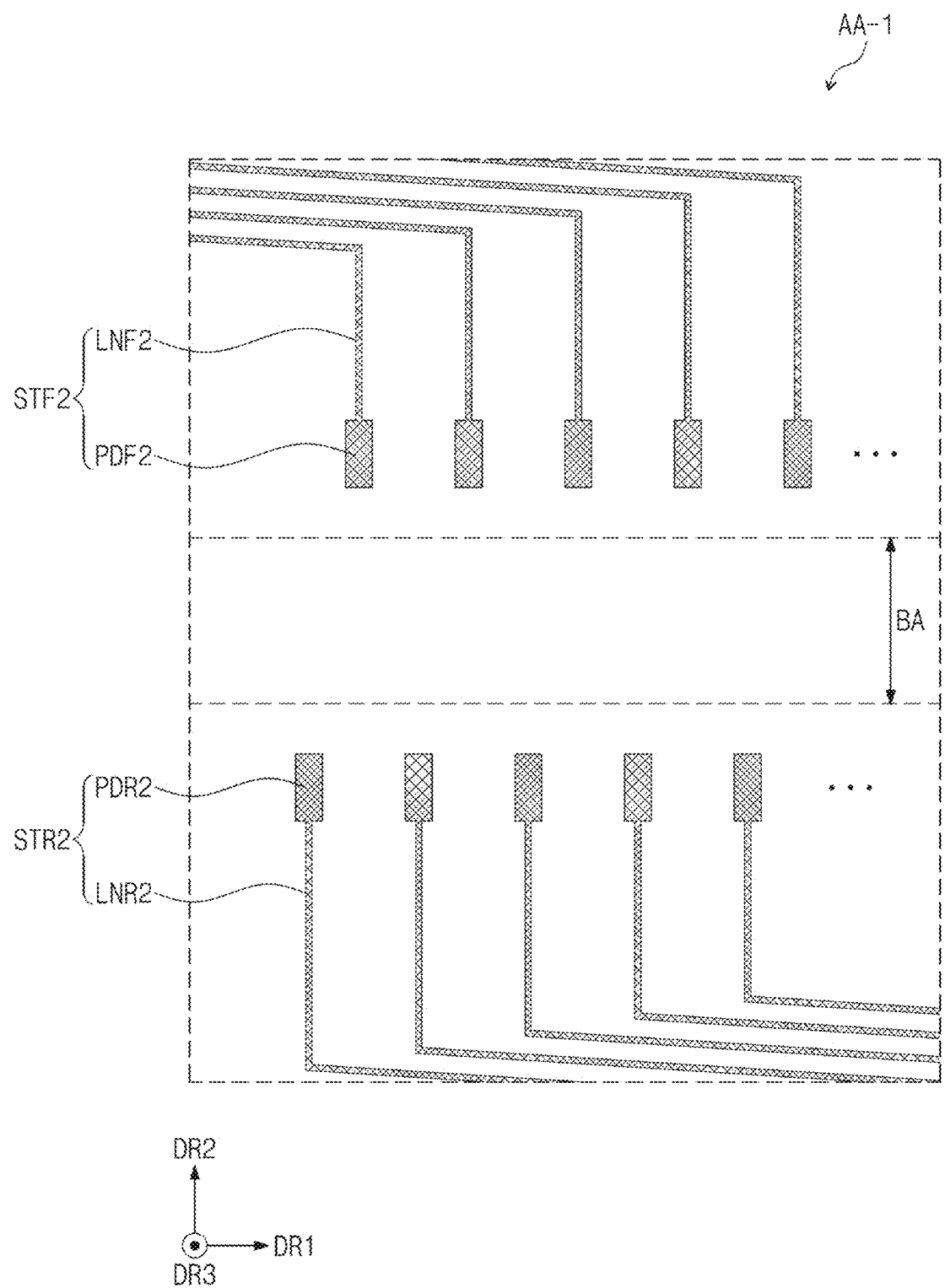

Referring to FIG. 10B, the second layer front signal line STF2 and the second layer rear signal line STR2 may be disposed in a same layer as each other. In an exemplary embodiment of the disclosure, the second layer front signal line STF2 and the second layer rear signal line STR2 may be disposed in a same layer as the second gate metal pattern GMP2.

The second layer front signal line STF2 may include a line part LNF2 and a pad part PDF2. The second layer rear signal line STR2 may include a line part LNR2 and a pad part PDR2.

Figure 10C:
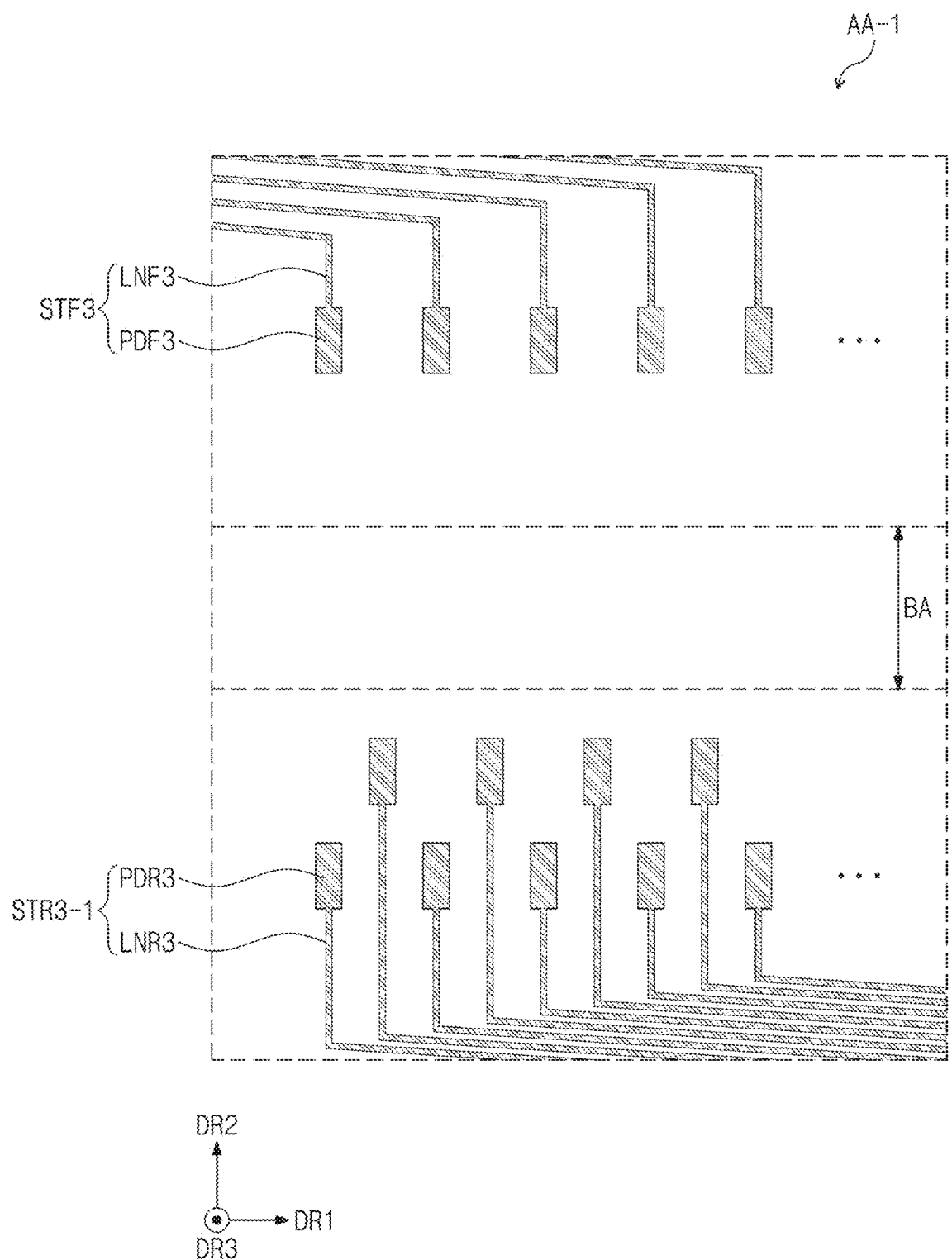

Referring to FIG. 10C, the third layer front signal line STF3 and the third layer rear signal line STR3-1 may be disposed in a same layer as each other. The third layer front signal line STF3 and the third layer rear signal line STR3-1 may be disposed in a same layer as the third gate metal pattern GMP3. The third layer rear signal lines STR3-1 may be connected to each of the first connection line LNC1-1 and the second connection line LNC2-1. Accordingly, a width between the third layer rear signal lines STR3-1 may be smaller than a width between the third layer rear signal lines STR3 shown in FIG. 8C.

The third layer front signal line STF3 may include a line part LNF3 and a pad part PDF3. The third layer rear signal line STR3-1 may include a line part LNR3 and a pad part PDR3.

Figure 10D:
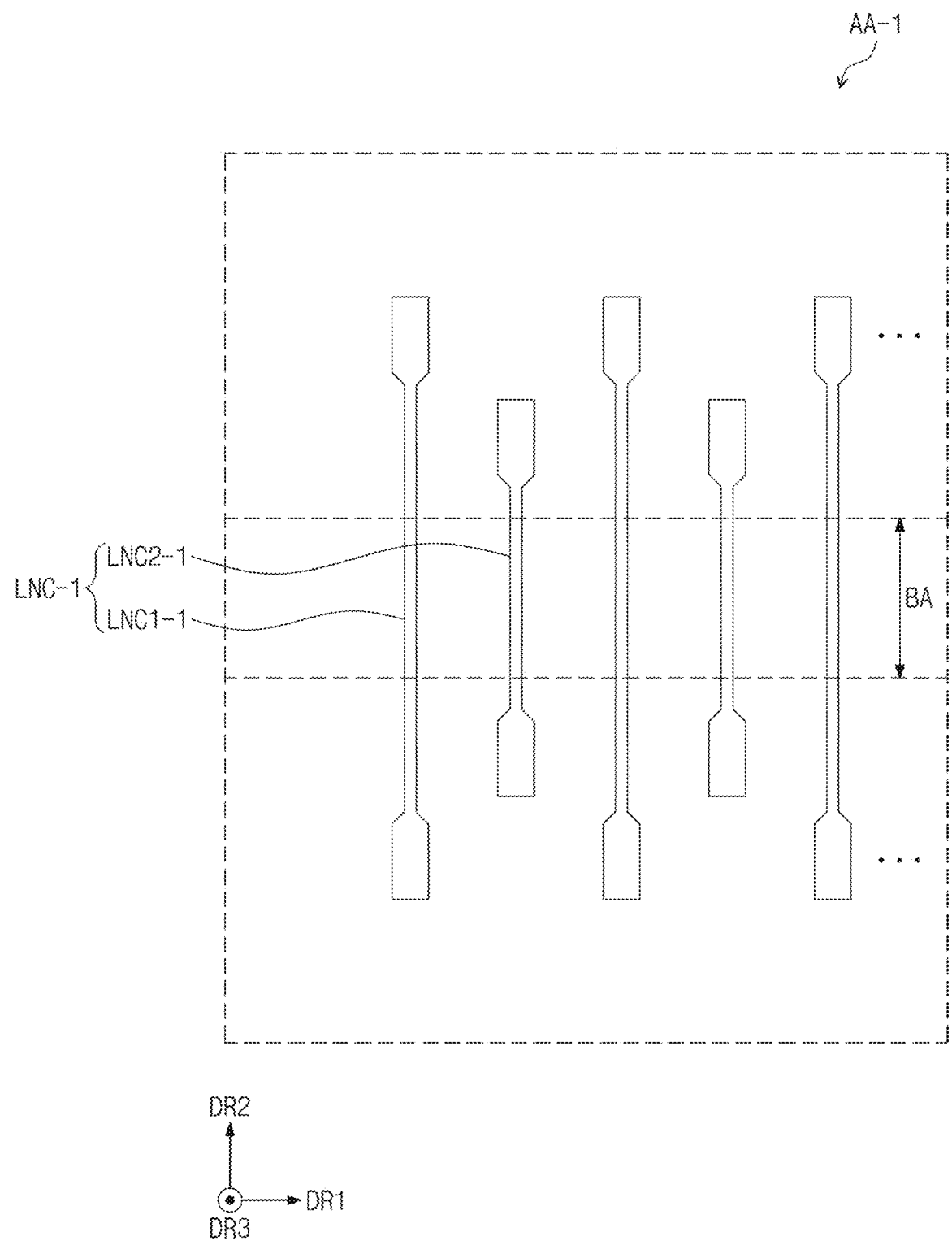

Referring to FIG. 10D, in an exemplary embodiment, the connection lines LNC1-1 and LNC2-1 may be disposed in a same layer as the second data metal pattern DMP2, but not being limited thereto or thereby. According to an alternative exemplary embodiment, the connection line LNC-1 may be disposed in a same layer as the first data metal pattern DMP1.

Features of the first connection line LNC1-1 and the second connection line LNC2-1 may be the same as those of the first connection line LNC1 and the second connection line LNC2 described above. In one exemplary embodiment, for example, each of the connection lines LNC1-1 and LNC2-1 may electrically connect a corresponding front signal line STF to a corresponding rear signal line STR through a contact hole CTH.

Herein, exemplary embodiments where the signal lines overlapping each other among the first layer front signal line STF1 to the third layer front signal line STF3 are combined with each other, but the disclosure should not be limited thereto or thereby. Alternatively, the signal lines disposed in different layers from each other, including the first layer rear signal line STR1 to the third layer rear signal line STR3, may be combined with each other in various ways.

Herein, one of two signal lines included in each of the front coupling signal line STF-P, the first rear coupling signal line STR-P, and the second rear coupling signal line STR-P1 may be referred to as an auxiliary signal line.

The invention should not be construed as being limited to the exemplary embodiments set forth herein. Rather, these exemplary embodiments are provided so that this disclosure will be thorough and complete and will fully convey the concept of the invention to those skilled in the art.

While the invention has been particularly shown and described with reference to exemplary embodiments thereof, it will be understood by those of ordinary skill in the art that various changes in form and details may be made therein without departing from the spirit or scope of the invention as defined by the claims.

What is claimed is:
1. A display device comprising:
 a base layer comprising a first portion, a second portion extending from the first portion, and a third portion extending from the second portion;
 a first light emitting element disposed on the first portion;
 a first front signal line electrically connected to the first light emitting element and disposed on the first portion;
 a second front signal line electrically connected to the first front signal line, disposed on the first portion, disposed in a different layer from the first front signal line, and overlapping the first front signal line;
 a first connection line electrically connected to the first front signal line and the second front signal line, disposed on the second portion, and disposed in a different layer from the first front signal line and the second front signal line; and
 a first rear signal line electrically connected to the first connection line and disposed on the third portion and disposed in a different layer from the second front signal line, and
 wherein the first front signal line and the first rear signal line are non-overlapped with the second portion respectively, and
 wherein the first front signal line and the first rear signal line are electrically connected through the first connection line and the first rear signal line is directly connected to the first connection line.
2. The display device of claim 1, wherein
 the second portion is bent, and the third portion overlaps the first portion when viewed in a plan view.

3. The display device of claim 2, further comprising:

a first insulating layer, a second insulating layer, a third insulating layer, and a fourth insulating layer, which are sequentially stacked on the base layer, wherein an opening is defined through the first insulating layer, the second insulating layer, the third insulating layer, and the fourth insulating layer to correspond to the second portion; and a fifth insulating layer disposed on the fourth insulating layer, wherein at least a portion of the fifth insulating layer is disposed inside the opening, wherein the first front signal line and the second front signal line are disposed at different positions among a first position, a second position and a third position, the first position is defined between the first insulating layer and the second insulating layer, the second position is defined between the second insulating layer and the third insulating layer, and the third position is defined between the third insulating layer and the fourth insulating layer.

4. The display device of claim 3, wherein the first connection line is disposed on the fifth insulating layer and overlaps the opening.

5. The display device of claim 3, wherein the first to fourth insulating layers comprise an inorganic material, and the fifth insulating layer comprises an organic material.

6. The display device of claim 3, further comprising:

a transistor disposed on the first portion of the base layer and electrically connected to the first light emitting element; and a connection electrode electrically connected to the transistor, wherein the transistor comprises a source, a drain, and an active, which are disposed under the first insulating layer, and a gate disposed between the first insulating layer and the second insulating layer, and the connection electrode is disposed at one of the first, second, and third positions.

7. The display device of claim 1, wherein the first rear signal line is disposed in a same layer the first front signal line.

8. The display device of claim 1, further comprising:

a fourth rear signal line electrically connected to the first connection line, disposed on the third portion, and disposed in a different layer from the first rear signal line.

9. The display device of claim 1, further comprising:

a data driving circuit disposed on the third portion, wherein the data driving circuit is electrically connected to the first rear signal line.

10. The display device of claim 1, wherein the first front signal line and the second front signal line comprise a first metal material, and the first metal material has a first specific resistance.

11. The display device of claim 10, wherein the first connection line comprises a second metal material different from the first metal material, and the second metal material has a second specific resistance different from the first specific resistance.

12. The display device of claim 1, further comprising:

a second light emitting element disposed on the first portion and arranged in a same pixel row as the first light emitting element;

a third front signal line electrically connected to the second light emitting element, disposed on the first portion, and disposed in a different layer from the first front signal line and the second front signal line;

a second connection line electrically connected to the third front signal line and disposed on the second portion; and a second rear signal line electrically connected to the second connection line and disposed on the third portion.

13. The display device of claim 12, further comprising:

a third rear signal line electrically connected to the second connection line, disposed on the third portion, and disposed in a different layer from the second rear signal line.

14. The display device of claim 13, wherein the third front signal line is disposed in a same layer as one of the second rear signal line and the third rear signal line.

* * * * *